(12) United States Patent
Besio et al.

(10) Patent No.: US 9,188,652 B2
(45) Date of Patent: Nov. 17, 2015

(54) MAGNETIC RESONANCE IMAGING APPARATUS WITH MEANS FOR CORRECTING MAGNETIC FIELD HOMOGENEITY

(75) Inventors: Stefano Besio, Genoa (IT); Felice Badino, Genoa (IT); Davide Carlini, Genoa (IT); Stefano Pittaluga, Genoa (IT); Vincenzo Punzo, S. Giorgio a Cremano (IT); Alessandro Trequattrini, Genoa (IT)

(73) Assignee: ESAOTE S.P.A., Milan (IT)

( * ) Notice: Subject to any disclaimer, the term of this patent is extended or adjusted under 35 U.S.C. 154(b) by 792 days.

(21) Appl. No.: 13/519,864
(22) PCT Filed: Jan. 18, 2011
(86) PCT No.: PCT/EP2011/050608
§ 371 (c)(1), (2), (4) Date: Jun. 28, 2012
(87) PCT Pub. No.: WO2011/089115
PCT Pub. Date: Jul. 28, 2011

(65) Prior Publication Data
US 2012/0286785 A1    Nov. 15, 2012

(30) Foreign Application Priority Data
Jan. 22, 2010    (IT) .............................. GE2010A0008

(51) Int. Cl.
*G01V 3/00*    (2006.01)
*G01R 33/38*    (2006.01)
(Continued)

(52) U.S. Cl.
CPC ........ *G01R 33/3806* (2013.01); *G01R 33/3873* (2013.01); *G01R 33/381* (2013.01); *G01R 33/383* (2013.01); *G01R 33/3875* (2013.01)

(58) Field of Classification Search
CPC .................................................... G01R 33/387
USPC ........... 324/319, 320, 318; 335/302, 306, 296
See application file for complete search history.

(56) References Cited

U.S. PATENT DOCUMENTS 4,675,609 A * 6/1987 Danby et al. ................... 324/318
4,682,111 A * 7/1987 Hughes ......................... 324/320
(Continued)

FOREIGN PATENT DOCUMENTS

EP    0 875 768 A2    11/1998
EP    0 957 369 A1    11/1999
(Continued)

OTHER PUBLICATIONS

International Search Report (PCT/ISA/210) issued on Mar. 21, 2011, by the European Patent Office as the International Searching Authority for International Application No. PCT/EP2011/050608.
(Continued)

*Primary Examiner* — Louis Arana
(74) *Attorney, Agent, or Firm* — Buchanan Ingersoll & Rooney PC

(57) ABSTRACT

A Magnetic Resonance apparatus includes a 3D structure having a cavity for receiving a body under examination, a mechanism for generating a static magnetic field in the patient receiving cavity, a mechanism for generating variable magnetic fields in the cavity, an antenna for transmitting electromagnetic nuclear spin excitation pulses, an antenna for receiving the electromagnetic signals generated by nuclear spin relaxation, a plate for locating and fixing magnetic dipoles for fine correction of magnetic field homogeneity, and a compartment for the magnetic correction dipole locating and fixing plate, the compartment being adapted to be opened for direct access to the magnetic correction dipole locating and fixing plate from the outside. The compartment may be opened either by removal of an end plate of the magnetic field generating mechanism, or via a lateral slot for insertion and removal of the magnetic correction dipole locating and fixing plate.

20 Claims, 24 Drawing Sheets

(51) Int. Cl.
*G01R 33/3873* (2006.01)
*G01R 33/381* (2006.01)
*G01R 33/383* (2006.01)
*G01R 33/3875* (2006.01)

(56) References Cited

U.S. PATENT DOCUMENTS

| | | | |
|---|---|---|---|
| 5,627,471 A * | 5/1997 | Kinanen | 324/319 |
| 6,130,538 A | 10/2000 | Carrozzi et al. | |
| 6,198,286 B1 | 3/2001 | Trequattrini et al. | |
| 6,255,928 B1 * | 7/2001 | van Oort et al. | 335/301 |
| 6,275,128 B1 | 8/2001 | Aoki et al. | |
| 6,313,634 B1 * | 11/2001 | Kasten | 324/320 |
| 6,765,382 B2 * | 7/2004 | Dewdney | 324/320 |
| 6,778,054 B1 | 8/2004 | Huang et al. | |
| 8,064,984 B2 * | 11/2011 | Satragno et al. | 600/415 |
| 2002/0167320 A1 | 11/2002 | Sato | |
| 2003/0011455 A1 | 1/2003 | Wakuda et al. | |
| 2005/0035765 A1 | 2/2005 | Higuchi | |

FOREIGN PATENT DOCUMENTS

| | | |
|---|---|---|
| EP | 0 965 305 A1 | 12/1999 |
| EP | 1 950 580 A2 | 7/2008 |
| EP | 2 113 781 A2 | 11/2009 |
| JP | 1-164356 A | 6/1989 |
| JP | 2000-333929 A | 12/2000 |
| JP | 2001-017405 A | 1/2001 |
| JP | 2002-153441 A | 5/2002 |
| JP | 2004-073752 A | 3/2004 |

OTHER PUBLICATIONS

Written Opinion (PCT/ISA/237) issued on Mar. 21, 2011, by the European Patent Office as the International Searching Authority for International Application No. PCT/EP2011/050608.

* cited by examiner

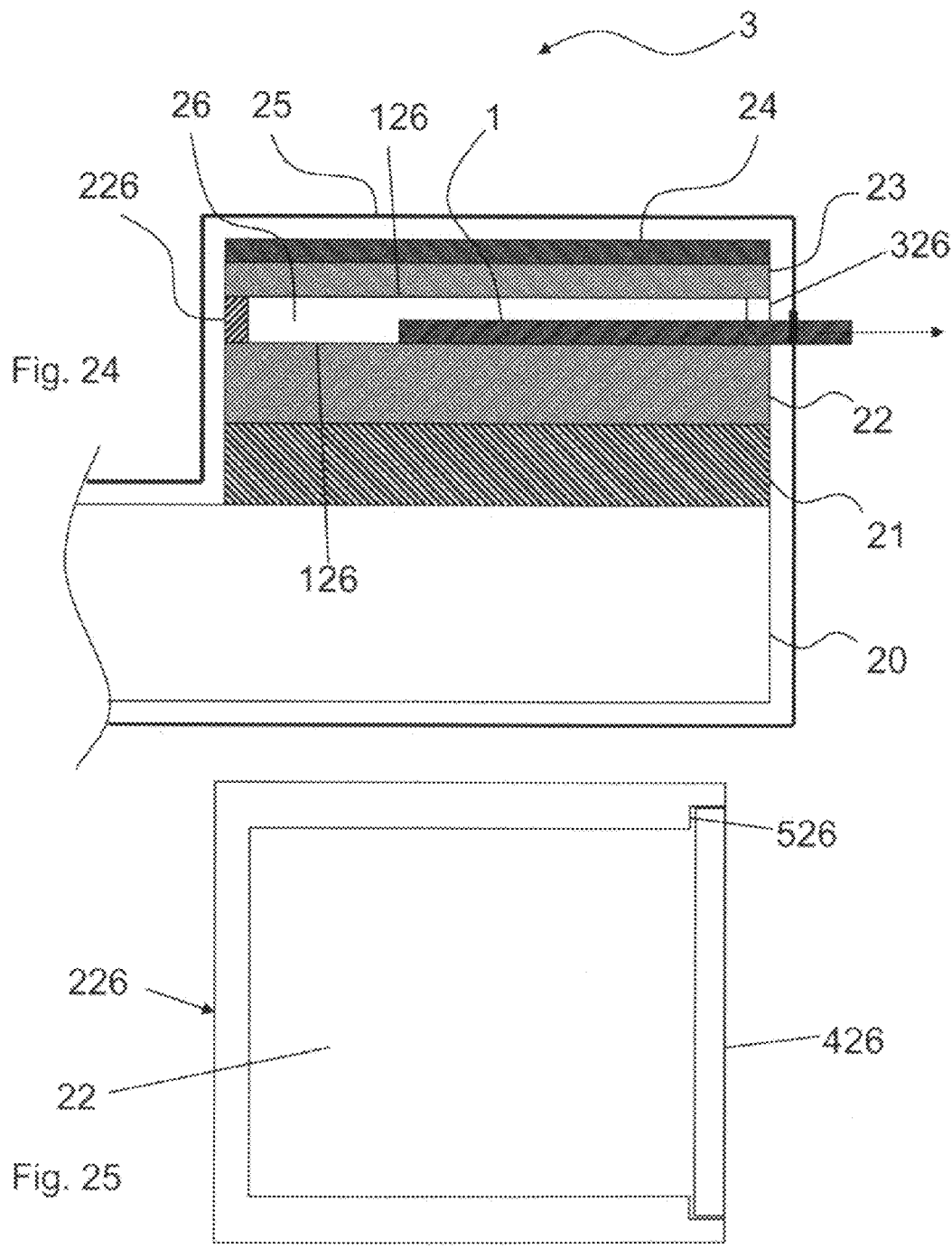

MAGNETIC RESONANCE IMAGING APPARATUS WITH MEANS FOR CORRECTING MAGNETIC FIELD HOMOGENEITY

The present invention relates to a Magnetic Resonance Imaging apparatus, comprising:

a 3D structure having a cavity for receiving a body under examination;

means for generating a static magnetic field in said patient receiving cavity;

means for generating variable magnetic fields, known as gradients, in said cavity;

an antenna for transmitting electromagnetic nuclear spin excitation pulses;

an antenna for receiving the electromagnetic signals generated by nuclear spin relaxation;

the means for generating the magnetic field in the patient receiving cavity consisting of at least a pair of magnets spaced from each other, so that the patient receiving cavity is interposed between said magnets;

at least one pole piece being mounted to the side of each magnet facing towards the patient receiving cavity;

and an end plate, known as gantry, being provided on the side of said pole piece facing towards the patient receiving cavity;

with a plate being provided for at least one of said pole pieces, in superimposed relation thereto, for locating and fixing magnetic dipoles for fine correction of magnetic field homogeneity, in view of performing the steps of the process known as shimming.

In traditional apparatus, this magnetic correction dipole locating and fixing plate is generally placed on the pole piece face oriented towards the patient receiving cavity, with the gradient field generating coils and the transmitting antenna being then mounted thereon, and further covered by the end plate.

This involves the drawback that, during maintenance, recalibration of magnetic field homogeneity requires disassembly of both non-functional parts of the apparatus, such as the chassis or the end plate, and the assembly of gradient field generating coils and/or the transmitting antenna, depending on the special construction of these elements.

The handling of functional parts, with electric connections, involves the risk of improper restoring the system during reassembly, which would affect proper operation of the apparatus.

Therefore, the maintenance operator is required to have an intensive knowledge of every construction detail of the apparatus, with the additional drawback of time consuming disassembly and reassembly procedures.

The present invention is intended to facilitate access to the magnetic correction dipole locating and fixing plate and, as a result, to allow magnetic field homogenization by the process known as shimming, to occur in a quicker and safer manner.

Therefore, the present invention is aimed at obviating the above drawbacks of prior art apparatus, and provides a magnetic resonance apparatus as described herein, wherein a compartment is formed between the end plate and the pole piece, for receiving the magnetic correction dipole locating and fixing plate, with one or more of said magnetic correction dipoles mounted thereto.

An advantageous effect of this construction approach consists in that a compartment is provided for homogeneity correction means, which is specially designed for these means, and for maintenance thereof, and is separated from any other compartment or element of the apparatus, which is only handled or processed during fabrication. This allows physical separation of the areas that require maintenance from the areas that are only affected by the fabrication process, and this wholly eliminates the risk that a maintenance step might involve operation on construction elements or adjustments or connections, established and finalized in pure fabrication processes.

The magnetic correction dipole locating and fixing plate is situated directly below the end plate that covers the pole piece, with said compartment being openable for access to the magnetic correction dipole locating and fixing plate by simple removal of the end plate.

This embodiment provides the advantage that it may be also implemented on existing apparatus with a few minor construction changes, to allow said compartment to be formed between the end plate and the pole piece, for the magnetic correction dipole locating and fixing plate to be placed directly below the end plate.

In one particular exemplary embodiment, the gradient field generating coils and the transmitting antenna are directly mounted to the pole piece, the compartment for the magnetic correction dipole locating and fixing plate being situated between said gradient field generating coils and said transmitting antenna on the one hand and the end plate on the other.

This provides immediate access to the magnetic correction dipole locating and fixing plate, by simple removal of the end plate, no operation being required on the gradient field generating coils and the transmitting antenna.

In an alternative embodiment of the present invention, said compartment is formed by a box like element being superimposed to the side of the pole facing the patient receiving cavity and placed between the pole and the end plate, the said box like element having two parallel sides which are parallel to the side of the pole facing the patient receiving cavity and lateral peripheral walls oriented perpendicular to the said two parallel walls, the distance of the said two parallel walls being bigger than the maximum thickness of the plate for locating and fixing magnetic dipoles and the said lateral peripheral walls being provided with an opening the thickness and the length of which allows the insertion inside the box like element and the extraction from the boxlike element of the said plate for locating and fixing magnetic dipoles, the said opening being provided in correspondence with a one of the side edges of the pole piece. Thus providing a box like element provided with an opening of such a width and height as to form a slot for insertion and removal of said magnetic correction dipole locating and fixing plate with one or more magnetic correction dipoles mounted thereto, the said plate can simply inserted or extracted like a drawer.

This alternative embodiment provides the important advantage of allowing removal and re-insertion of the magnetic correction dipole locating and fixing plate without operating on any part of the apparatus, particularly without even removing the end plate.

Nevertheless, unlike the first embodiment, this alternative embodiment doesn't provide the advantage of easy integration in existing structures and requires the apparatus to be designed anew.

Advantageously, in one embodiment, the direction of insertion and removal of said magnetic correction dipole locating and fixing plate is parallel to the surface of said plate and/or pole piece and/or end plate and the compartment has lateral slide guides for removal and insertion of the magnetic correction dipole locating and fixing plate, which cooperate with corresponding sliding elements of the magnetic correction dipole locating and fixing plate, which guides are oriented parallel to each other and to the surface of said magnetic correction dipole locating and fixing plate and/or the pole piece and/or the end plate.

Thus, the magnetic correction dipole locating and fixing plate may be easily displaced to the removed position and reinserted into the operating position by sliding it along said guides.

The plate for locating and fixing the magnetic correction dipoles may have any shape and normally the shape is equivalent to the shape of pole piece or at least the symmetry of the shape of the said plate is equivalent with the one of the pole. Here it is intended the planar shape of the pole. When the shape of the said plate is not square or rectangular or does not have at least two opposed parallel sides oriented in the direction of insertion and extraction from the said compartment than the said plate can be inscribed in a such a kind of frame or on the side of the plate facing the pole one or more parallel guides may be provided which are oriented in direction of insertion and extraction and which cooperate with one or more guides on the said pole.

As a further alternative solution the two parallel walls of the box like element which are parallel to the side of the pole facing the patient receiving cavity and or the end plate are formed on one side by the said side of the said pole and on the other side by the end plate, a spacer rim or frame being provided between the said end plate and the said pole, the said rim or frame being opened at one side forming an opening the thickness and the length of which allows the insertion inside the box like element and the extraction from the boxlike element of the said plate for locating and fixing magnetic dipoles, the said opening being provided in correspondence with a one of the side edges of the pole piece.

According to still another embodiment the said compartment is formed by a recess in the side of the pole facing the patient receiving cavity, the said pole being provided on the side facing the patient receiving cavity with a peripheral rim forming the lateral peripheral walls of the compartment while the said end plate is supported by the said peripheral rim, closing the compartment on the side facing the patient receiving cavity and at least one part of the rim is removably secured to the pole forming the closing member of an opening for inserting and extracting the plate for locating and fixing the magnetic correction dipoles.

In a further embodiment, the magnetic correction dipole locating and fixing plate has a plurality of recesses for receiving magnetic correction dipoles, which provides the advantage of quick and accurate positioning of magnetic correction dipoles into their predetermined positions.

In this embodiment, the recesses have a plan shape and a depth that match those of one or more correction dipoles, so that the latter may be held in concealed relation in said recesses.

Furthermore, one or more types of correction dipoles may be provided, each of said types having a plan shape and/or a plan size differing from those of the other types, the recesses in the magnetic correction dipole locating and fixing plate having a plan shape and a plan size equal to or slightly larger than those of the type of magnetic correction dipoles with the maximum plan size.

This ensures that each magnetic correction dipole can be held in any desired recess of the plate.

In a particular embodiment, each of the additional types of magnetic correction dipoles having smaller sizes than those of the magnetic correction dipoles with the maximum plan size and/or shapes different therefrom is associated with a housing frame whose plan shape and whose outer size match those of the type of magnetic correction dipoles with the maximum plan size, and which have a housing recess therein having a plan shape that matches that of the corresponding additional type of the correction dipoles, and a size equal to or slightly larger than it.

Thus, this construction features allows said housing frame to accurately accommodate in any desired recess of the magnetic correction dipole locating and fixing plate a magnetic correction dipole having any plan shape and a plan size smaller than the maximum size according to which these recesses have been formed.

In one additional embodiment, the recesses have different depths in different areas of the magnetic correction dipole locating and fixing plate, to accommodate dipoles of different heights.

In a further embodiment, the magnetic correction dipole locating and fixing plate is composed of a base plate with one or more apertured plates lying thereon, the latter plates having one or more through apertures whose shape and size match those of the recesses for the magnetic correction dipoles, at least some of said apertures in one of said apertured plates being coincident with the apertures of at least one further apertured plate, the apertures of the apertured plates forming the peripheral walls of said recesses.

This provides flexibility in the construction of said magnetic correction dipole locating and fixing plate, the latter being basically composed of a base plate and a plurality of apertured plates in superimposed relation to form said recesses.

Advantageously, certain apertured plates may be designed to extend over part of the overall surface area of the base plate or an underlying aperture plate and/or have thicknesses differing from each other and/or from the thickness of the base plate.

The above arrangements may be provided in any combination or subcombination, with the static magnetic field generating magnets being either of permanent type, e.g. formed of layers of a magnetic material, as disclosed, for instance in EP 0 957 369 or of resistive or superconducting type, as disclosed, for instance, in EP 0 875 769 by the applicant hereof.

These and other features and advantages of the present invention will appear more clearly from the following description of a few embodiments, illustrated in the annexed drawings, in which:

FIG. 24, is a further embodiment of the said compartment.

FIG. 25 is a particular of the rim 220 of the pole of the embodiment according to FIGS. 4, 5 and 22.

Figure 1:
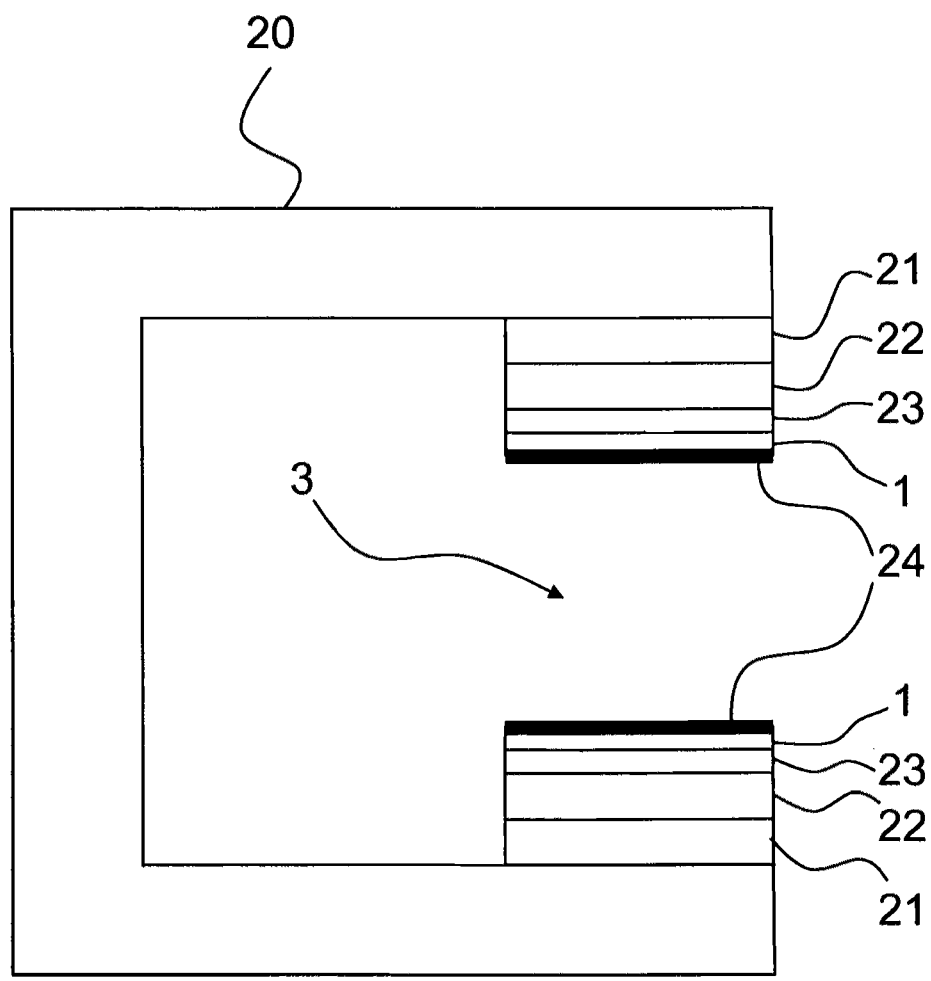
FIG. 1 is a diagrammatic general view of a Magnetic Resonance Imaging apparatus of the present invention.

FIG. 1 is a diagrammatic general view of the Magnetic Resonance Imaging apparatus of the present invention, which apparatus comprises: a 3D structure having a cavity 3 for receiving a body under examination; means for generating a static magnetic field in said patient receiving cavity. In this first embodiment, said means 21 consist of at least one pair of permanent magnets 21 disposed in spaced relation and in such position that the patient receiving cavity 3 is interposed between said permanent magnets 21, said permanent magnets being connected together by a C-shaped yoke 20; means for generating variable magnetic fields, known as gradients, in said cavity, an antenna for transmitting electromagnetic nuclear spin excitation pulses; an antenna for receiving the electromagnetic signals generated by nuclear spin relaxation.

The yoke 20 may be replaced by any load-bearing structure that simply acts as a mechanical support and not as a magnetic yoke.

Said variable magnetic field generating means, particularly gradient field generating coils, and said transmitting antenna are generally designated by numeral 23.

A pole piece 22 is mounted to the side of each permanent magnet 21 that faces towards the patient receiving cavity 3, and an end plate 24, known as gantry, is provided on the side of said pole piece 22 that faces towards the patient receiving cavity 3.

A plate 1 is also provided in superimposed relation to the pole piece 22, for locating and fixing magnetic dipoles for fine correction of magnetic field homogeneity, for the purposes of shimming.

A compartment is formed between the end plate 24 and said pole piece 22, for receiving the magnetic correction dipole locating and fixing plate 1, with one or more of said magnetic correction dipoles mounted thereto, said magnetic correction dipole locating and fixing plate 1 being situated directly below the end plate 24 that covers said pole piece 22.

Said compartment is openable and the magnetic correction dipole locating and fixing plate 1 can be accessed by simply removing the end plate 24.

The permanent magnets 21 are each formed of at least one layer of magnetized material, with the side facing towards the patient receiving cavity 3 having at least one layer of ferromagnetic material, that forms said pole piece 22, lying thereon.

One non-limiting example of this configuration is disclosed in EP2113781 and EP1950580 and EP957369.

Figure 2:
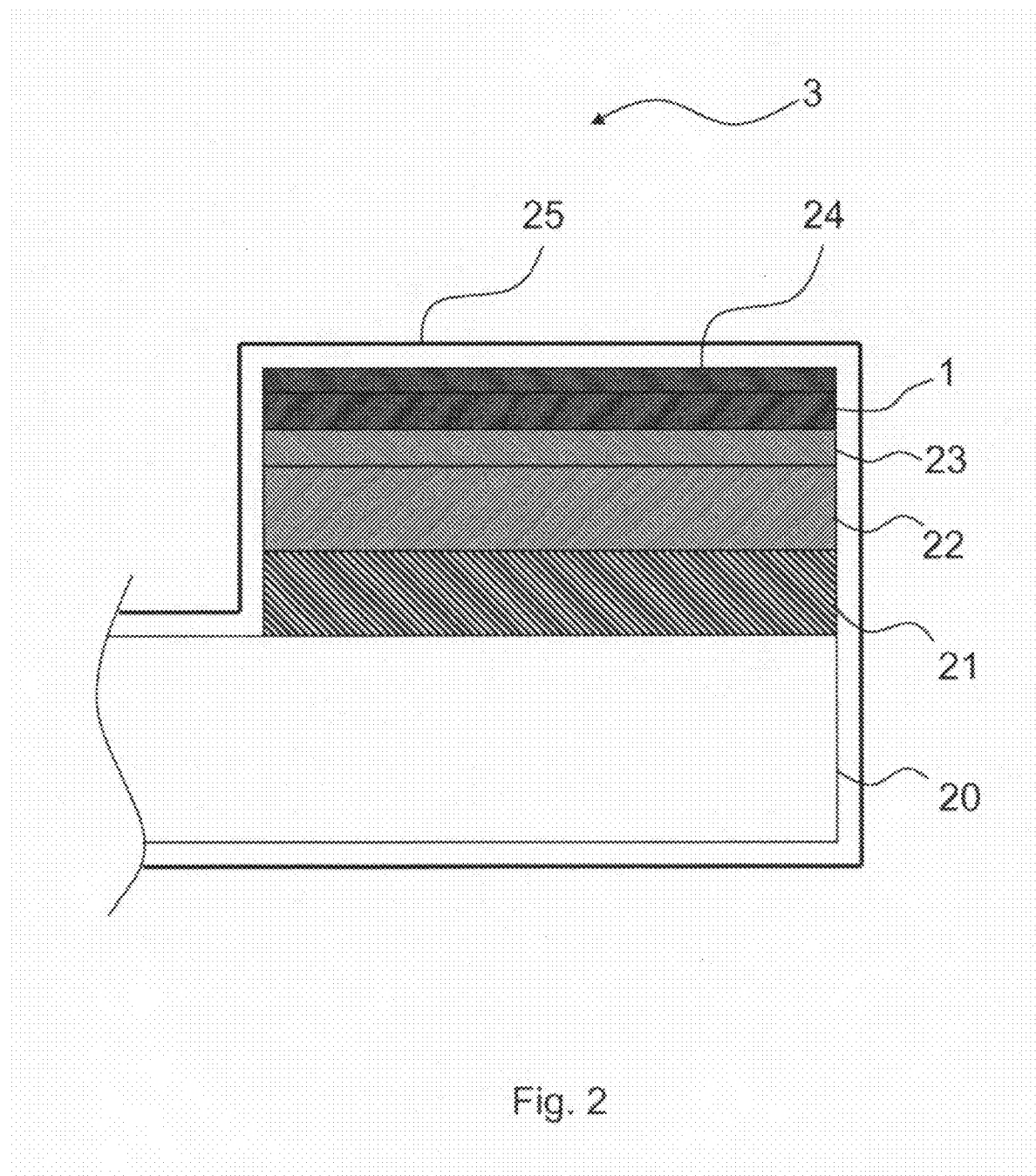
FIGS. 2, 3 and 4 are each a diagrammatic cross sectional detail view of the lower permanent magnet and the functional parts lying thereon, in three variant embodiments.

FIG. 2 shows a detail of the lower permanent magnet 21, with the pole piece 22 lying thereon; said compartment for the magnetic correction dipole locating and fixing plate 1 is formed between the pole piece 22 and the end plate 24.

In the particular exemplary embodiment of FIG. 2, the gradient field generating coils and the transmitting antenna 23 are directly mounted to the pole piece 22, the compartment for the magnetic correction dipole locating and fixing plate being situated between said gradient field generating coils and said transmitting antenna 23 on the one hand and the end plate 24 on the other.

All the parts that lie over the permanent magnet 22 are covered by a chassis 25.

Figure 3:
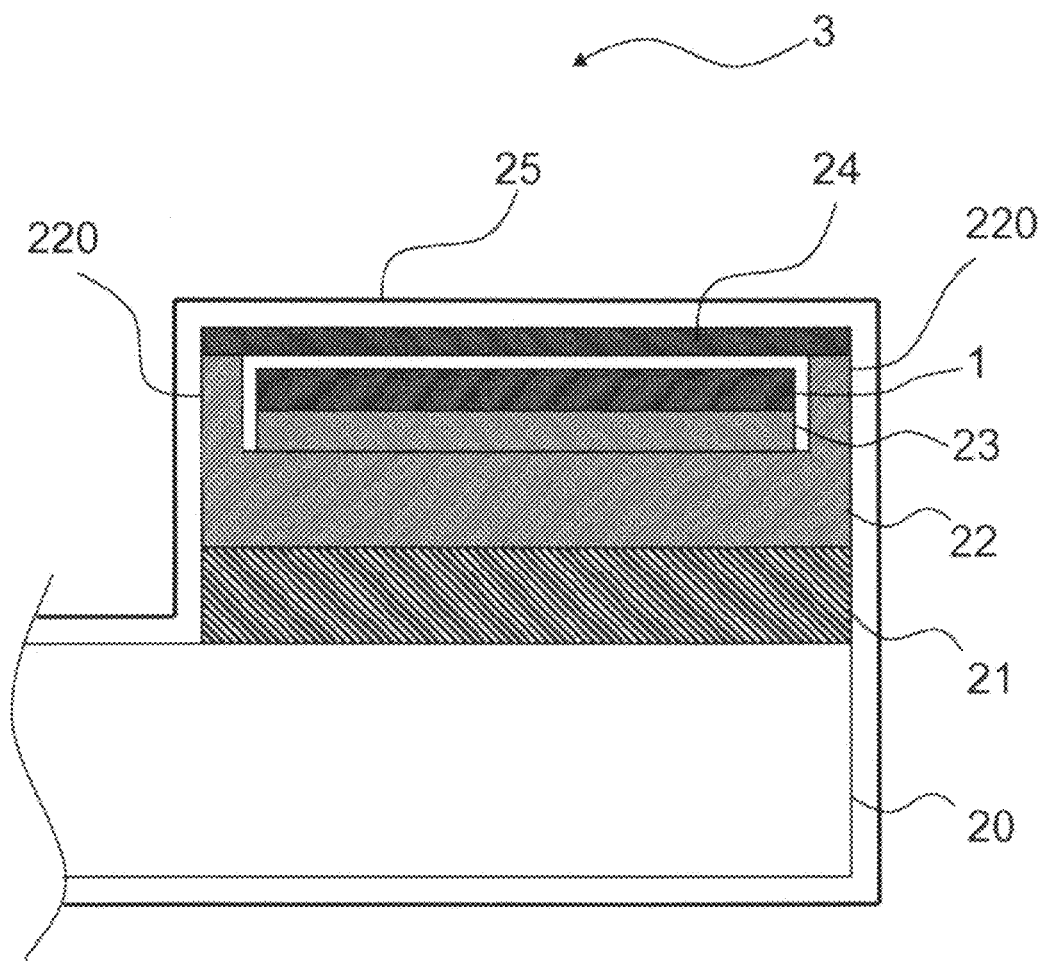

The compartment 26 is clearly visible in FIG. 3, which shows a variant embodiment in which the pole piece 22 has a peripheral edge 220 extending towards the patient receiving cavity 3 and has the end plate 24 fixed thereon.

Figure 4:
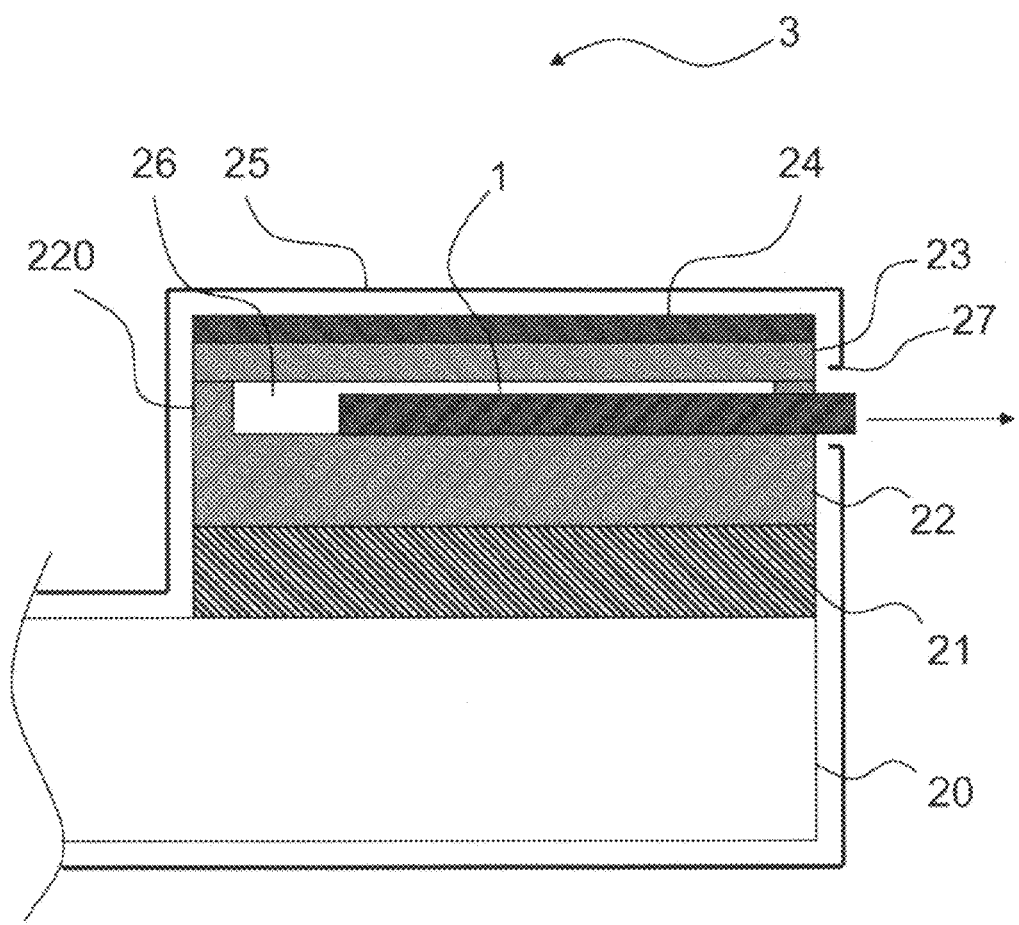

FIG. 4 shows a further embodiment, in which said compartment 26 for the magnetic correction dipole locating and fixing plate 1 with one or more of said magnetic correction dipoles mounted thereto is formed between the end plate 24 and said pole piece 22, and said compartment 26 is openable at one of the side edges of the pole piece 22 by the provision of a slot for insertion and removal 27 of said magnetic correction dipole locating and fixing plate 1 with one or more magnetic correction dipoles mounted thereto.

The direction of insertion and removal of said magnetic correction dipole locating and fixing plate is parallel to the surface of said plate.

In the figure, the gradient field generating coils and the transmitting antenna 23 are interposed between the magnetic correction dipole locating and fixing plate 1 and the end plate 24.

In one embodiment, not shown, the gradient field generating coils and the transmitting antenna 23 might be also interposed between the magnetic correction dipole locating and fixing plate 1 and the pole piece 22, such configuration constituting no hindrance to lateral removal of the magnetic correction dipole locating and fixing plate 1.

Figure 5:
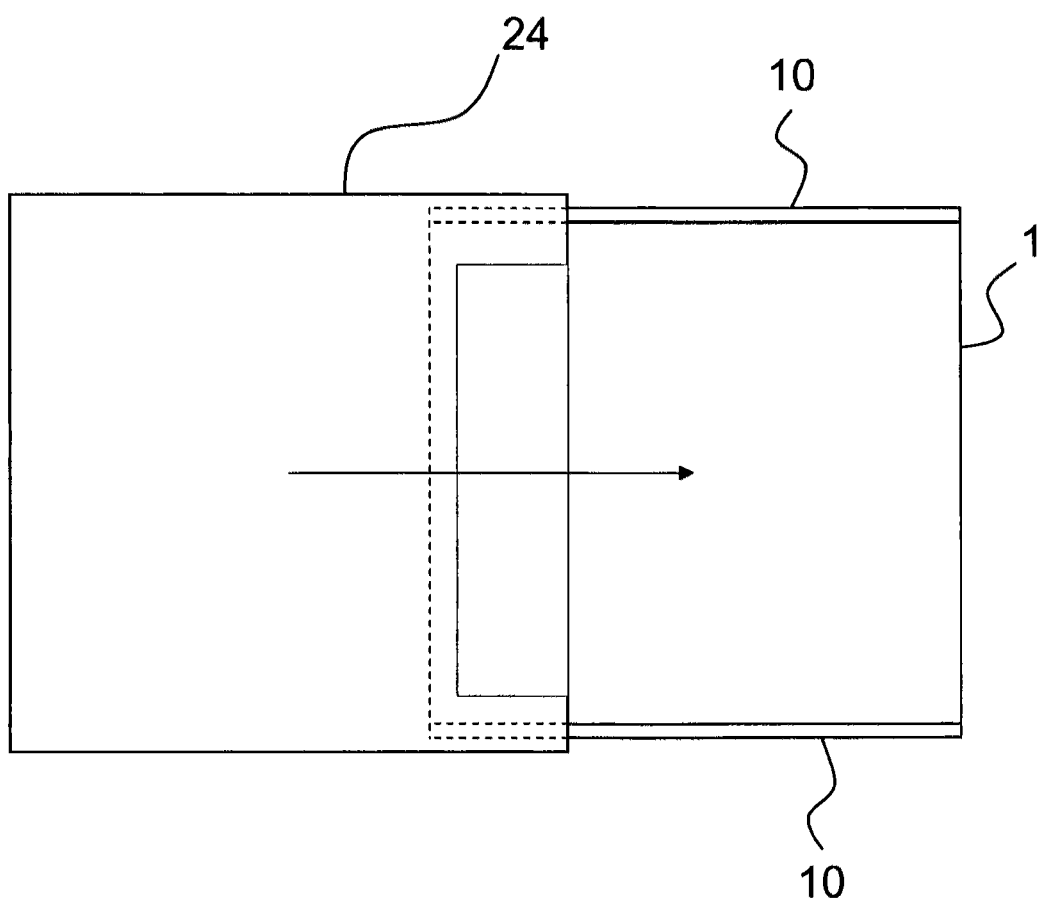
FIG. 5 is a diagrammatic top detail view of the lower permanent magnet and the functional parts lying thereon.

FIG. 5 is a top view, showing the step of removing the magnetic correction dipole locating and fixing plate 1 in the direction designated by the arrow.

Therefore, the figure shows the end plate 24 and part of the magnetic correction dipole locating and fixing plate 1 being extracted.

It also shows two slide elements 10 of the magnetic correction dipole locating and fixing plate 1, which are designed to cooperate with corresponding lateral slide guides in the compartment 26, not shown, for removal and insertion of the magnetic correction dipole locating and fixing plate, said guides being oriented parallel to each other and parallel to the surface of said magnetic correction dipole locating and fixing plate 1.

Limit stops are also provided for the motion of removal of the magnetic correction dipole locating and fixing plate 1 from said compartment 26 through said insertion and removal slot 27.

The opening of the peripheral rim 220 of the pole 22 for allowing the insertion or extraction of the plate 1 can be obtained by providing that the peripheral rim 220 is formed, by a removable part, at least for a certain length corresponding to the width of the said opening for inserting and extracting of the plate 1. The possible magnetic field aberrations which are determined by the said removable part of the rim 220 are so called systematic aberrations which are practically identical for every magnet and the compensation of which can be considered in the magnet design and particularly in the design and construction of the plate 1, which can be provided with the correction dipoles for compensating the said aberration in order to compensate the said systematic aberrations. The correct positioning of the rim can simply be ensured by end stops provided on the pole or on the resting part of the rim 220, such as for example the one illustrated in FIG. 25 and indicated with numerals 320, 420. Here the removable part of the rim 220 has a stepped end sides which fits with correspondingly stepped end sides of the resting part of the rim 220.

Figure 23:
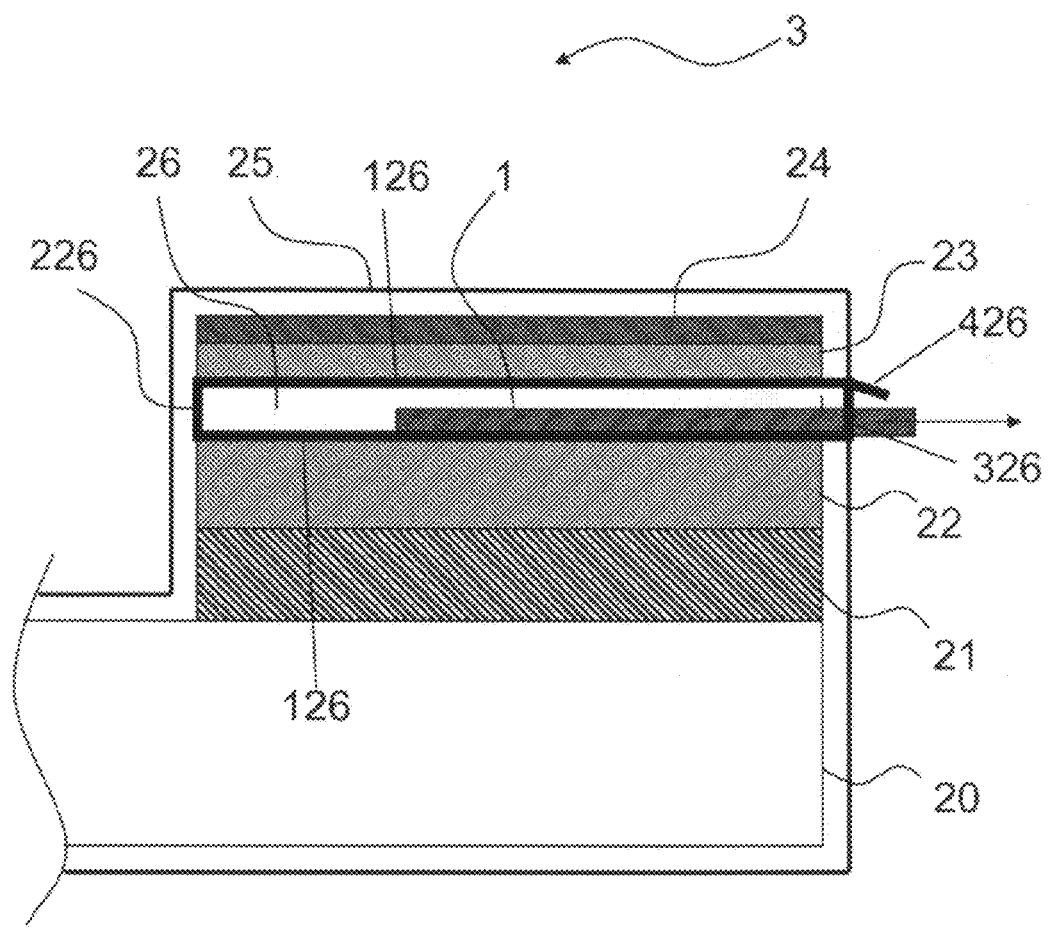
FIG. 23 illustrates a first embodiment of the invention in which the compartment for receiving the magnetic correction dipole locating and fixing plate is formed by a box like element.

In FIG. 23 the compartment 26 is formed by a box like element. This box like element has two parallel walls 126, which are parallel to the side of the pole 22 facing the patient receiving cavity and the end plate 24 and which are held spaced apart by a peripheral lateral wall 226. This wall is perpendicular to the two parallel walls and has an height which is bigger than the maximum thickness of the plate 1 for locating and fixing the magnetic correction dipoles.

One part of the said peripheral wall is opened or can be opened by removing a certain part 426 of the said lateral, peripheral wall 226 having the function of a removable closure, thus forming an opening or slot 326 for inserting or extracting the plate 1.

According to the embodiment of FIG. 24, the two parallel walls of each one of the said box like element are made by the side of the poles and by the end plate 24. A spacer rim is provided which holds the end plate 24 at a certain distance from the corresponding pole 22 is provided. The spacer rim forming the peripheral wall 226 of the box like element and a part 426 of the said spacer rim cam be removed for forming an opening 326 allowing the insertion and extraction from the compartment of the said plate 1 for locating and fixing the magnetic correction dipoles. For allowing the said removable part 426 of the rim to be placed always in the same position when closing the opening 326, stop means are provided which can be of any kind. One embodiment illustrated in FIG. 25 is in the from of end steps 526 of the end sides of the branches of the peripheral rim 226 delimiting the opening. This stepped sides forms end stops for positioning the removable rim part 426.

The box like element can be placed anywhere between the pole 22 and the end plate 24, this means, either directly underneath the end plate 24, or between the transmitting antenna and the gradient coils or between the pole and the gradient coils. According to this in the above embodiment of FIGS. 24 and 25, between the pole 22 and the plate 1 in the box like element there can be placed the gradient coils. The transmitting antenna can be placed either between the plate 1 and the end plate 24 or between the gradient coils and the plate 1.

Figure 6:
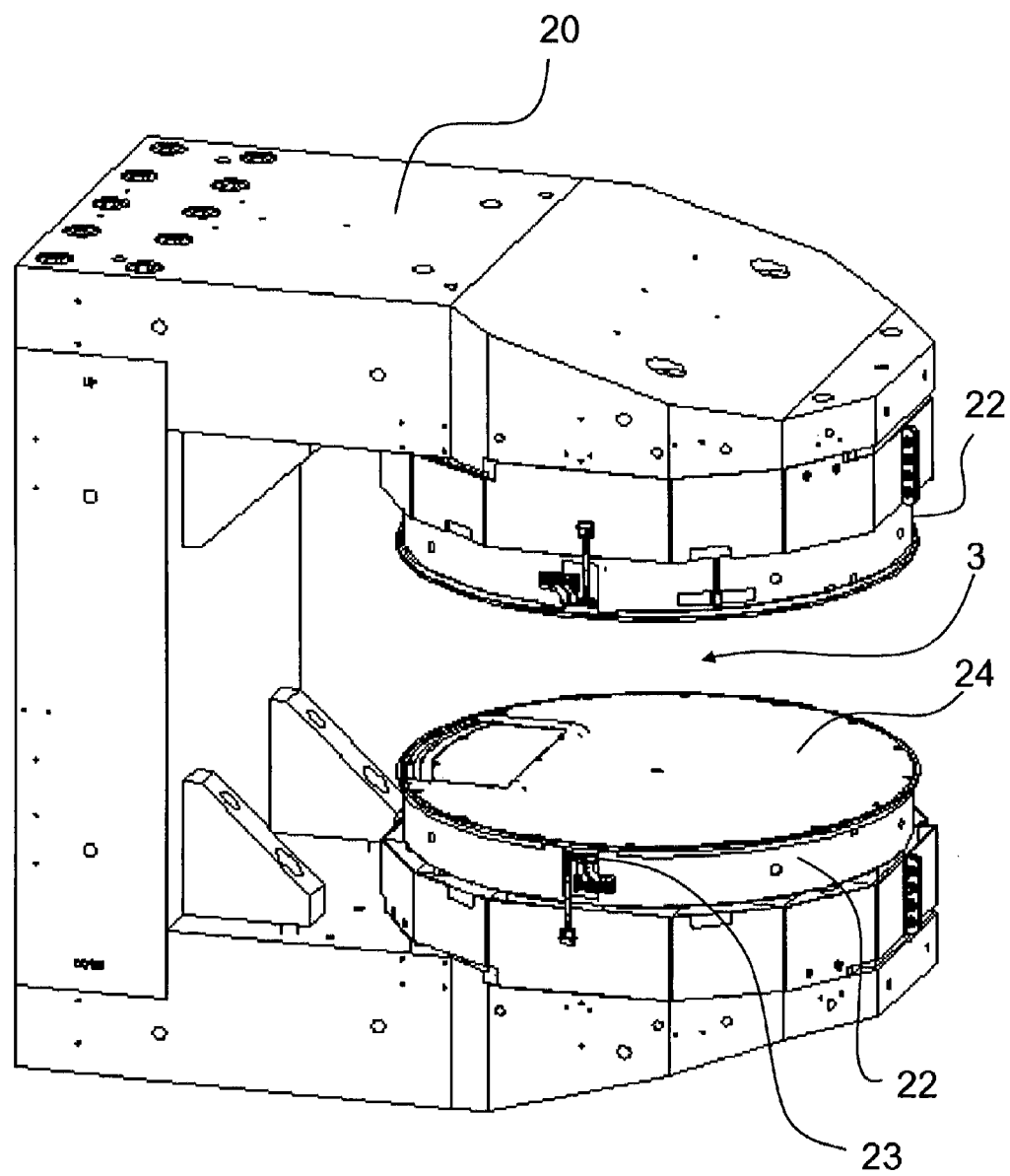
FIG. 6 is a general view of an embodiment of the Magnetic Resonance Imaging apparatus of the present invention.

FIG. 6 is a general view of an embodiment of the Magnetic Resonance Imaging apparatus of the present invention, which clearly shows the yoke 20, the pole pieces 22 and the patient receiving cavity 3 interposed therebetween, the end plate 24 placed above the functional parts lying on the pole piece 22, among which the gradient field generating coils and the transmitting antenna 23 are only shown.

Figure 7:
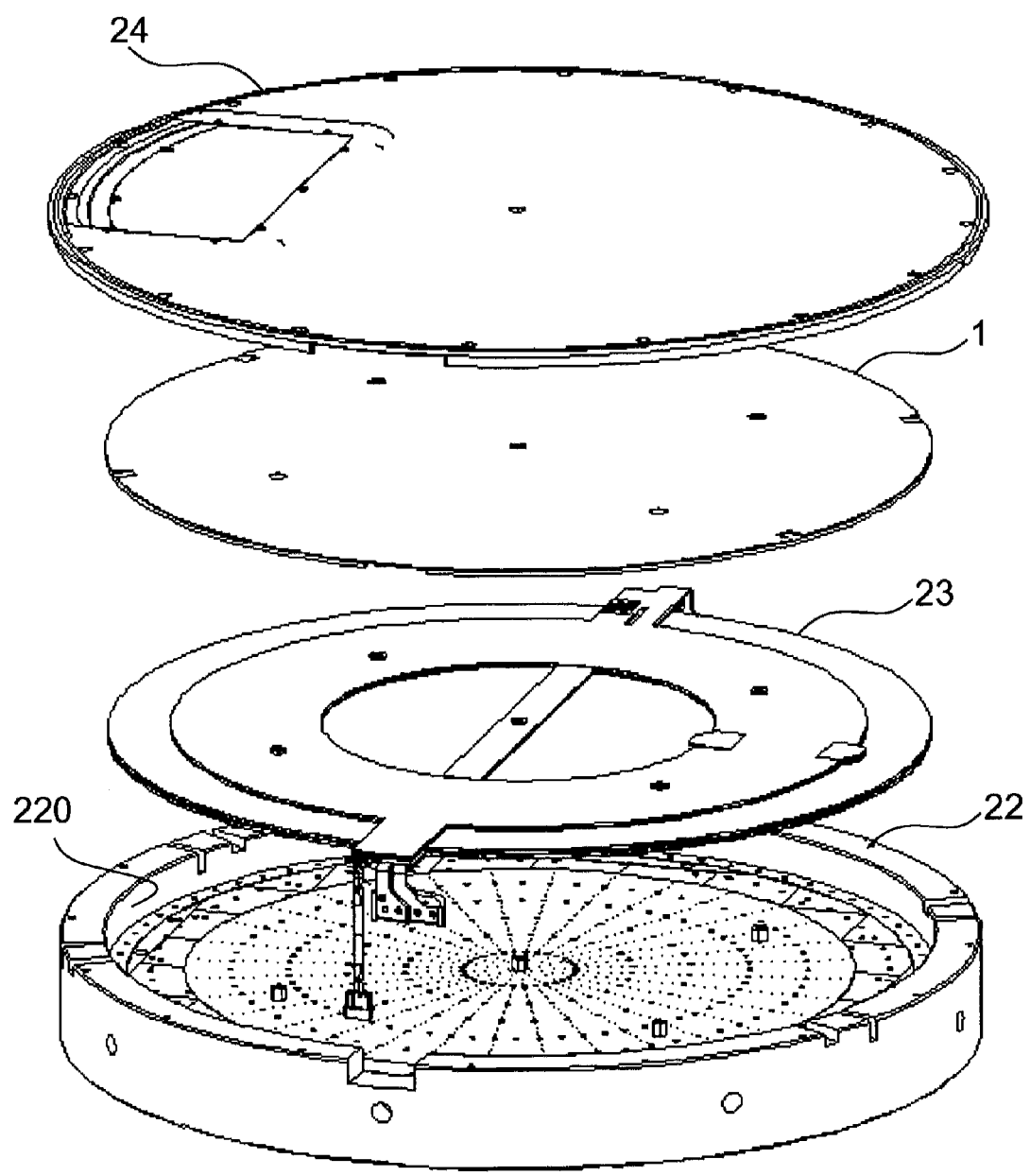
FIG. 7 is an exploded perspective view of the functional parts lying on the permanent magnet.
Figure 9:
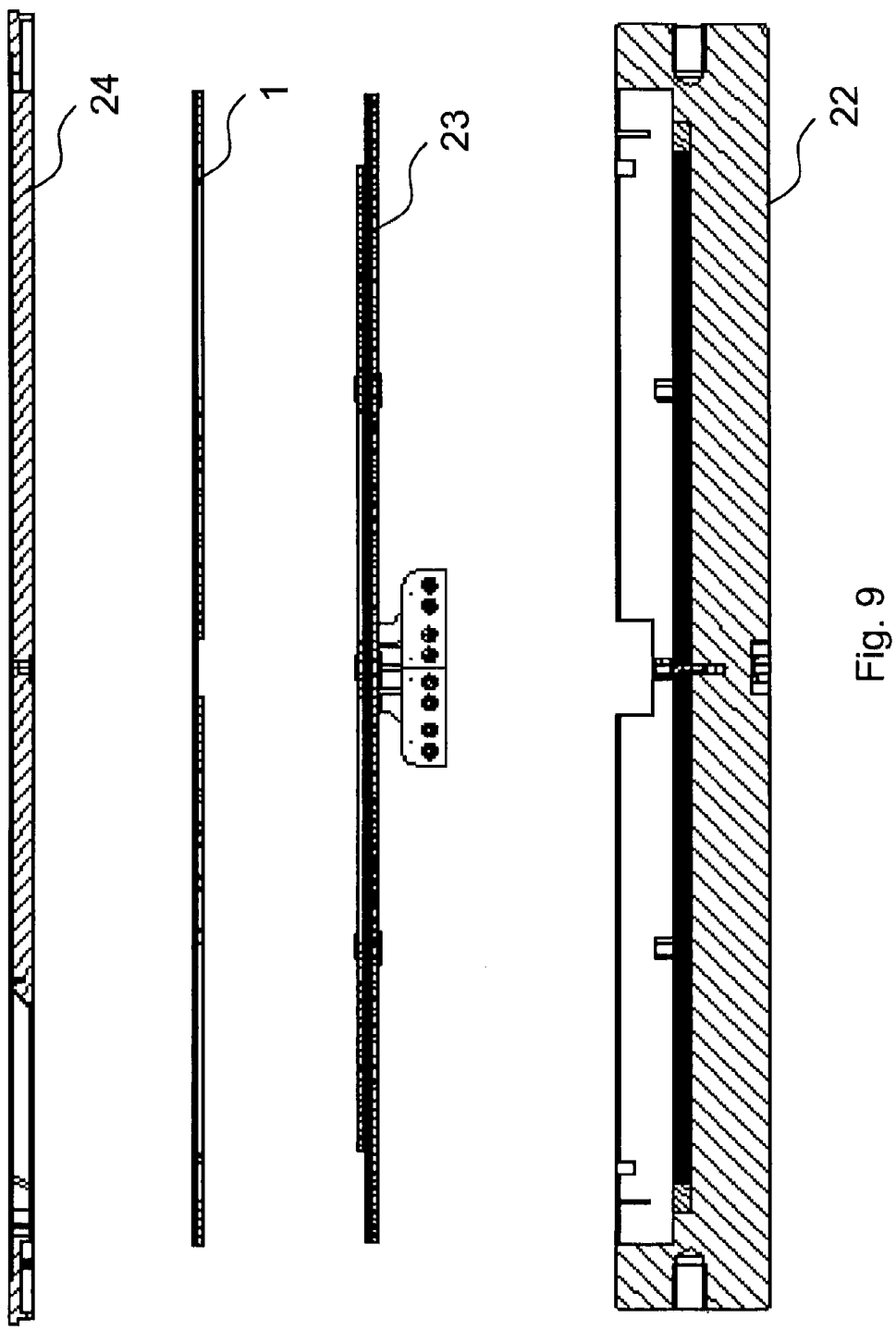
FIG. 9 is an exploded side view of the functional parts lying on the permanent magnet.

Detailed views of these functional parts are visible in FIGS. 7 and 9, which show an exploded perspective view and an exploded side view of such parts respectively: the pole piece 22 has the gradient field generating coils and the transmitting antenna 23, the magnetic correction dipole locating and fixing plate 1 and the end plate 24 stacked thereon, in this order.

The gradient field generating coils and the transmitting antenna 23 and the magnetic correction dipole locating and fixing plate 1 are held in the corresponding compartment formed in the pole piece 22 by the raised peripheral edge 220.

Figure 8:
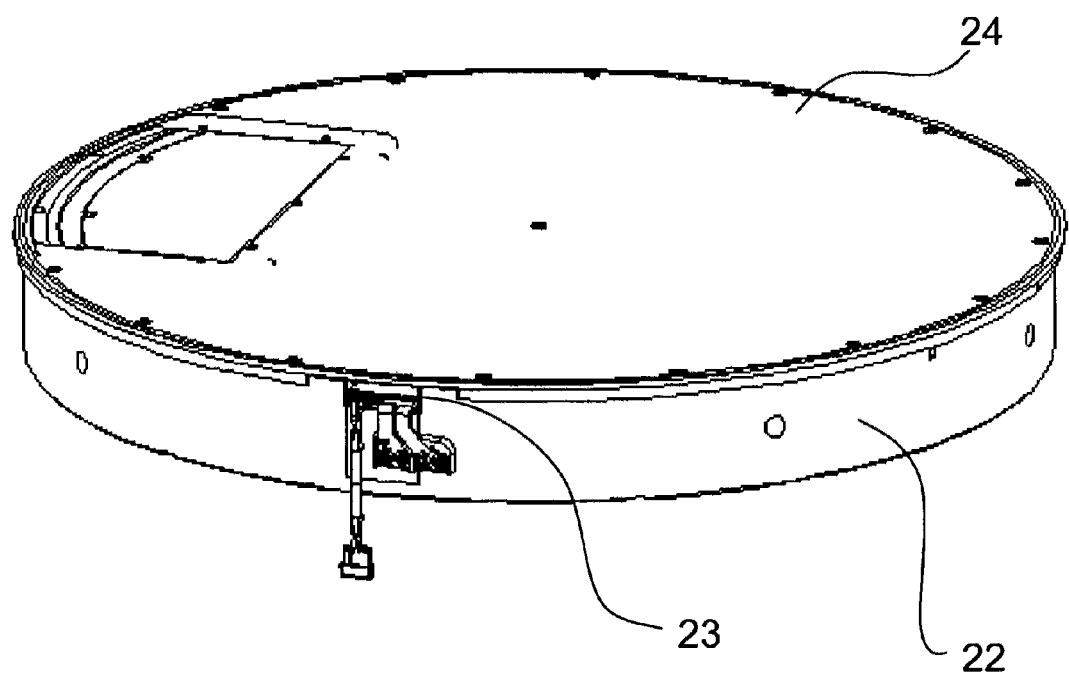
FIG. 8 is a perspective view of the functional parts lying on the permanent magnet, in assembled relation.
Figure 10:
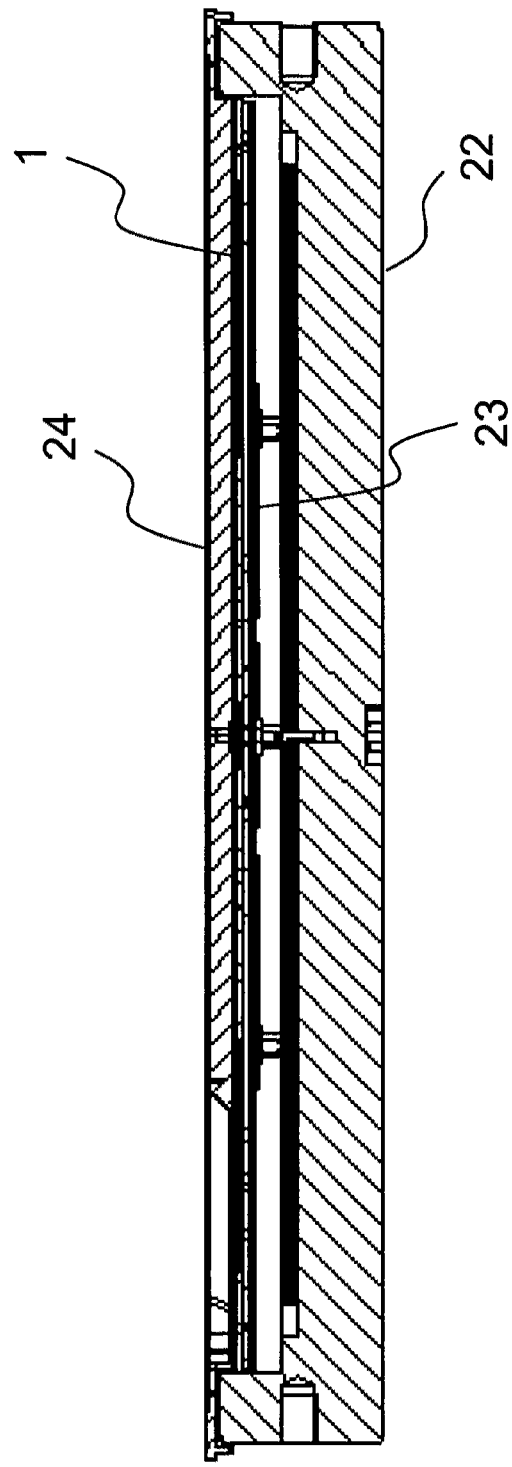
FIG. 10 is a side view of the functional parts lying on the permanent magnet, in assembled relation.

A perspective view and a side view of these components in assembled relation are shown in FIGS. 8 and 10 respectively.

Figure 11:
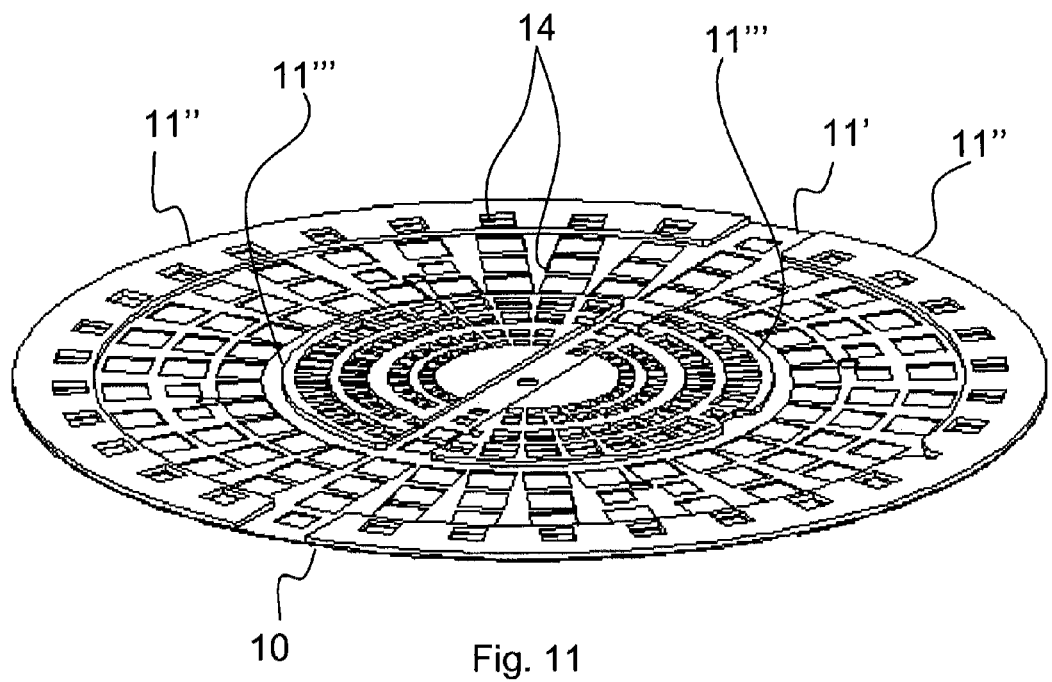
FIG. 11 is a view of the components of the magnetic correction dipole locating and fixing plate in assembled relation.

FIG. 11 is a perspective view of the magnetic correction dipole locating and fixing plate 1, with the components thereof in assembled relation.

This magnetic correction dipole locating and fixing plate 1 has a plurality of recesses 14 for receiving magnetic correction dipoles which recesses 14 have a plan shape and a depth that match those of one or more correction dipoles, so that the latter are held in concealed relation in said recesses 14.

As shown, the recesses 14 have different depths in different areas of the magnetic correction dipole locating and fixing plate 1.

In the embodiment as shown herein, this is obtained by forming the magnetic correction dipole locating and fixing plate 1 out of a base plate 10 and one or more, preferably three apertured plates 11, lying thereon, which are designated by numerals 11', 11" and 11'''.

Figure 12:
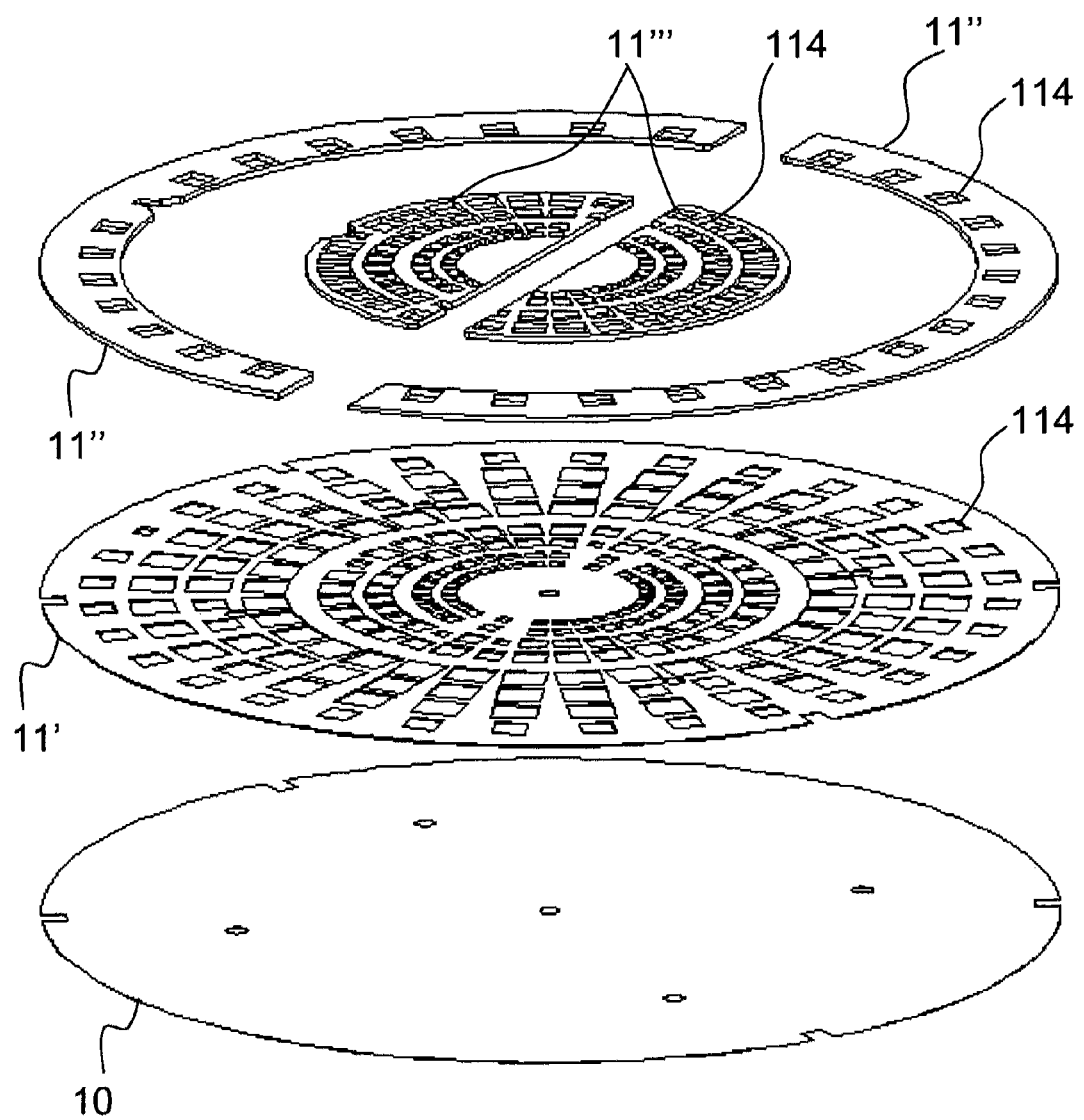
FIG. 12 is an exploded view of the components of the magnetic correction dipole locating and fixing plate.

These apertured plates 11, as shown in FIG. 12, have one or more through holes 114 whose shape and size match those of the recesses 14 for holding the magnetic correction dipoles, and at least some of these apertures in each apertured plate 11 are coincident with the apertures 114 of at least one additional apertured plate 11, so that the apertures 114 of the apertured plates 11 form the peripheral walls of said recesses 14.

This is particularly apparent in FIG. 12, in which the apertured plates 11 and the base plate 10, which form the magnetic correction dipole locating and fixing plate 1, are shown in an exploded view.

The magnetic correction dipole locating and fixing plate 1 is composed of a base plate 10 and a plurality of apertured plates 11, some of which extend over part of the overall surface area of the base plate 10 or an underlying apertured plate 11.

The apertured plate 11' is placed on the base plate 10, with the apertured plates 11', shaped as half-ring bands to be placed thereon at the periphery, and the apertured plates 11''', shaped as half circles to be placed thereon at the center.

Figure 13:
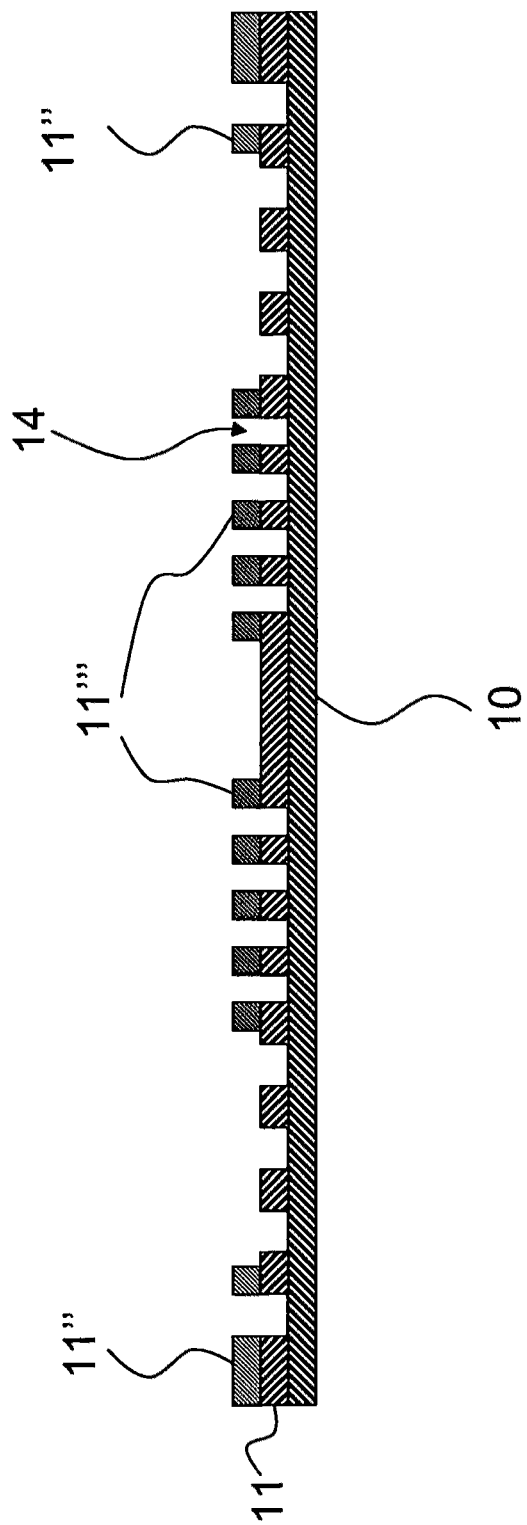
FIG. 13 is a cross sectional view of the components of the magnetic correction dipole locating and fixing plate in assembled relation.

A cross sectional view of the magnetic correction dipole locating and fixing plate 1, with the components assembled, is shown in FIG. 13; here the recesses 14 formed by the overlapped apertures 114 of the apertured plates are clearly visible.

According to a further embodiment, at least some of the apertured plates 11 are thicker than other apertured plates 11.

Figure 14:
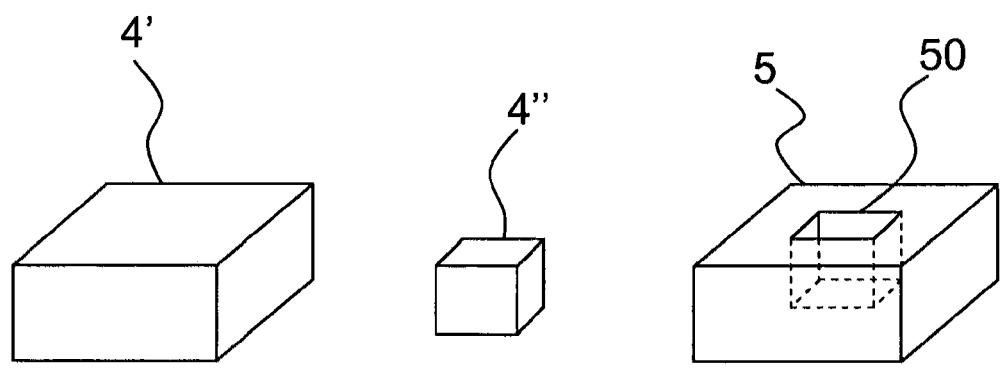
FIG. 14 shows the magnetic correction dipoles and a housing frame for the magnetic correction dipole of smaller size.
Figure 15:
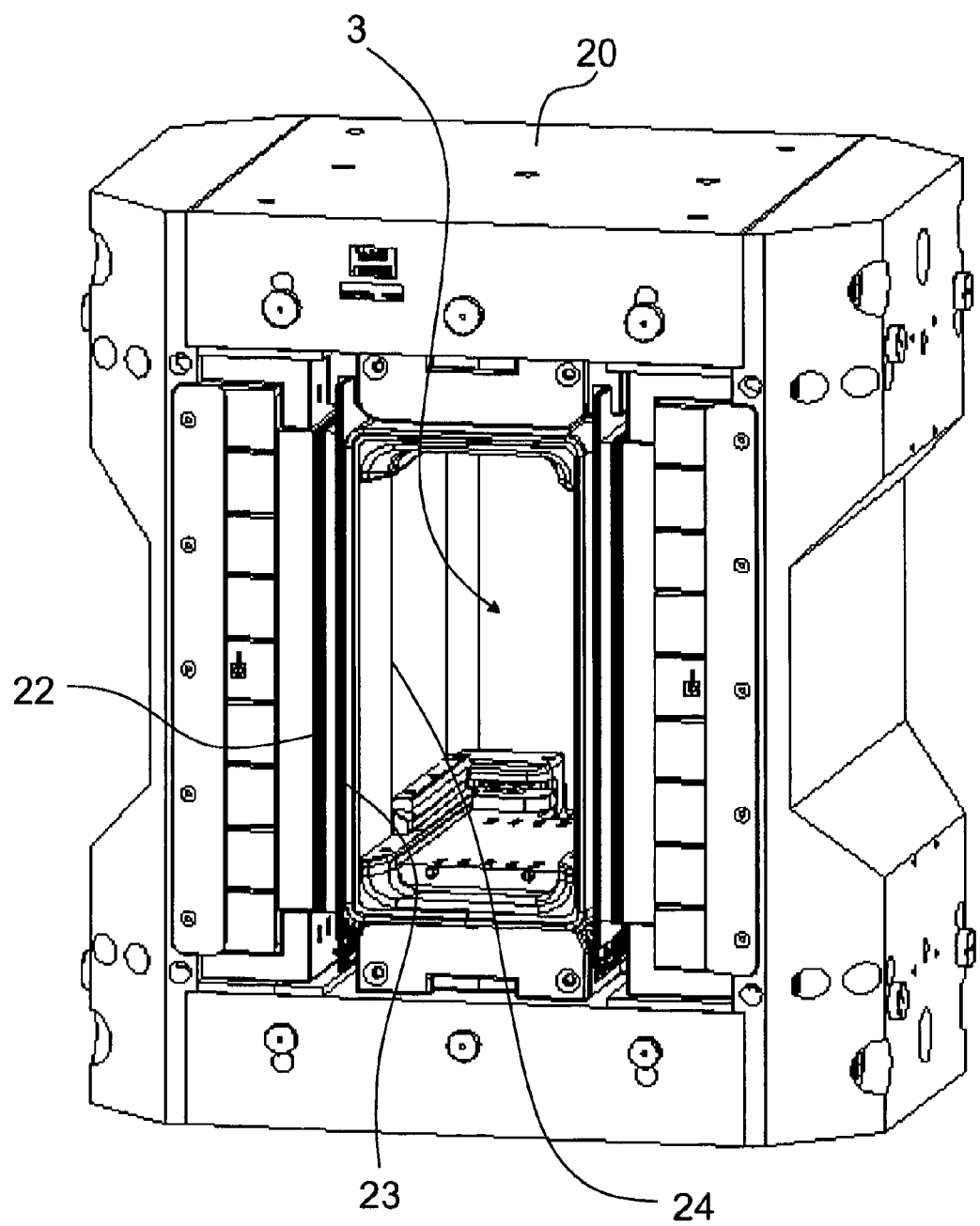
FIG. 15 is a general view of an additional embodiment of the Magnetic Resonance Imaging apparatus of the present invention.
Figure 16:
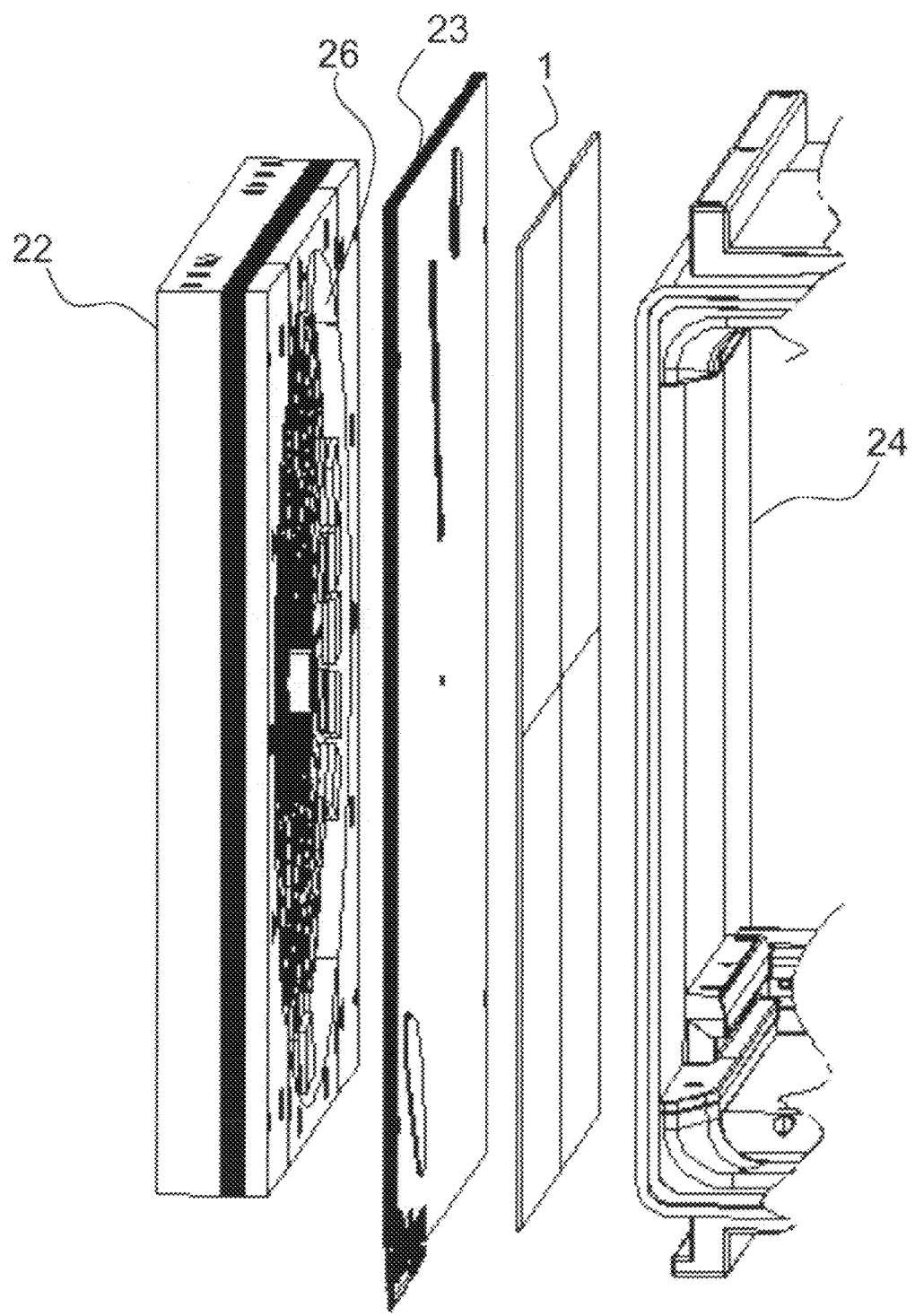
FIG. 16 is an exploded perspective view of the functional parts lying on the permanent magnet, according to such additional embodiment.
Figure 17:
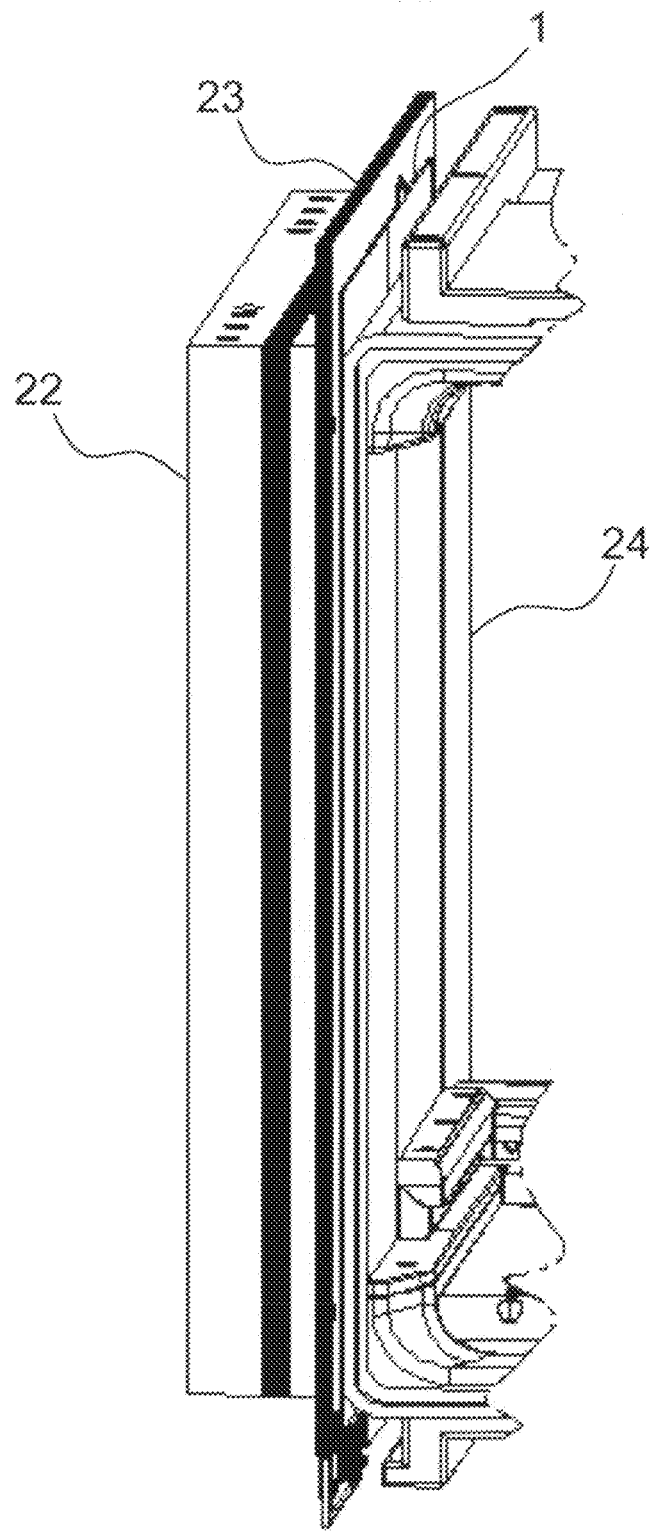
FIG. 17 is a perspective view of the functional parts lying on the permanent magnet, in assembled relation according to such additional embodiment.
Figure 18:
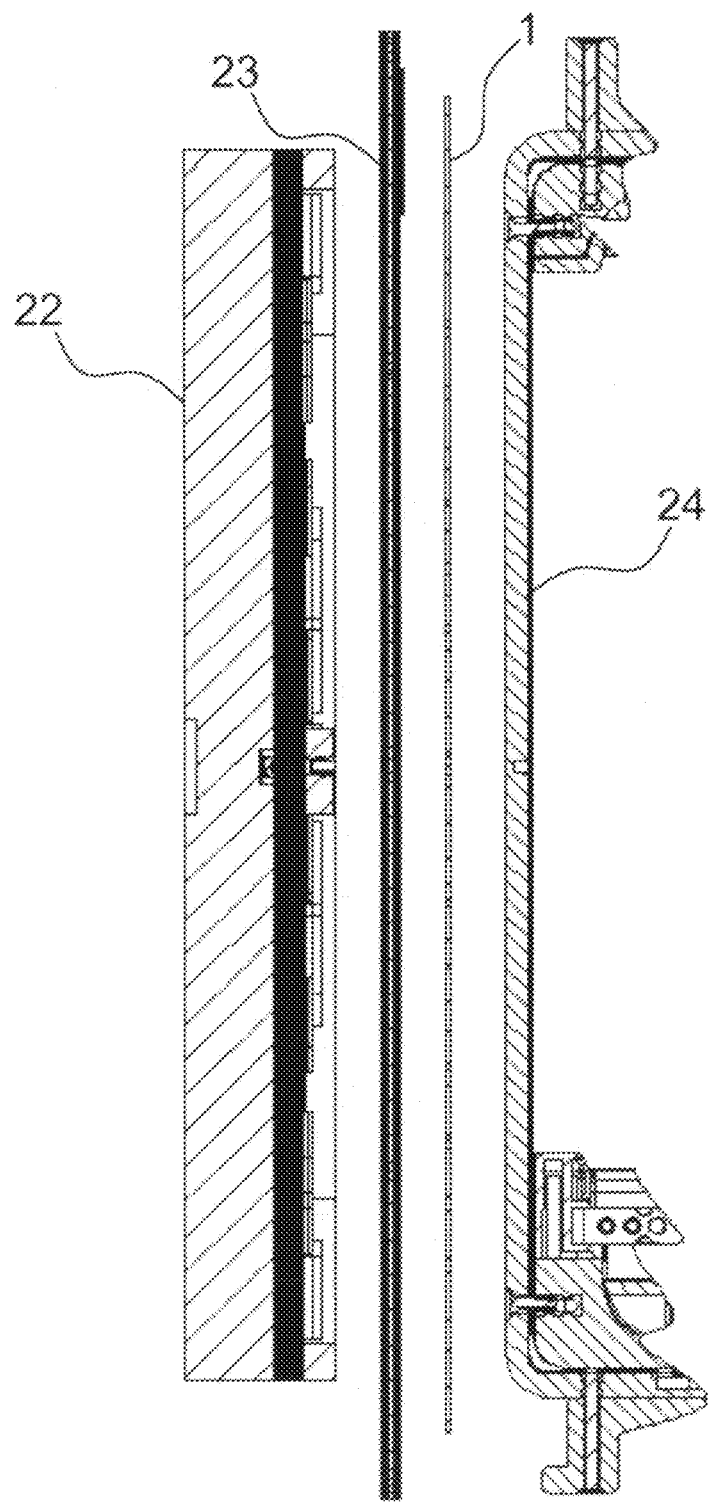
FIG. 18 is an exploded side view of the functional parts lying on the permanent magnet, according to such additional embodiment.
Figure 19:
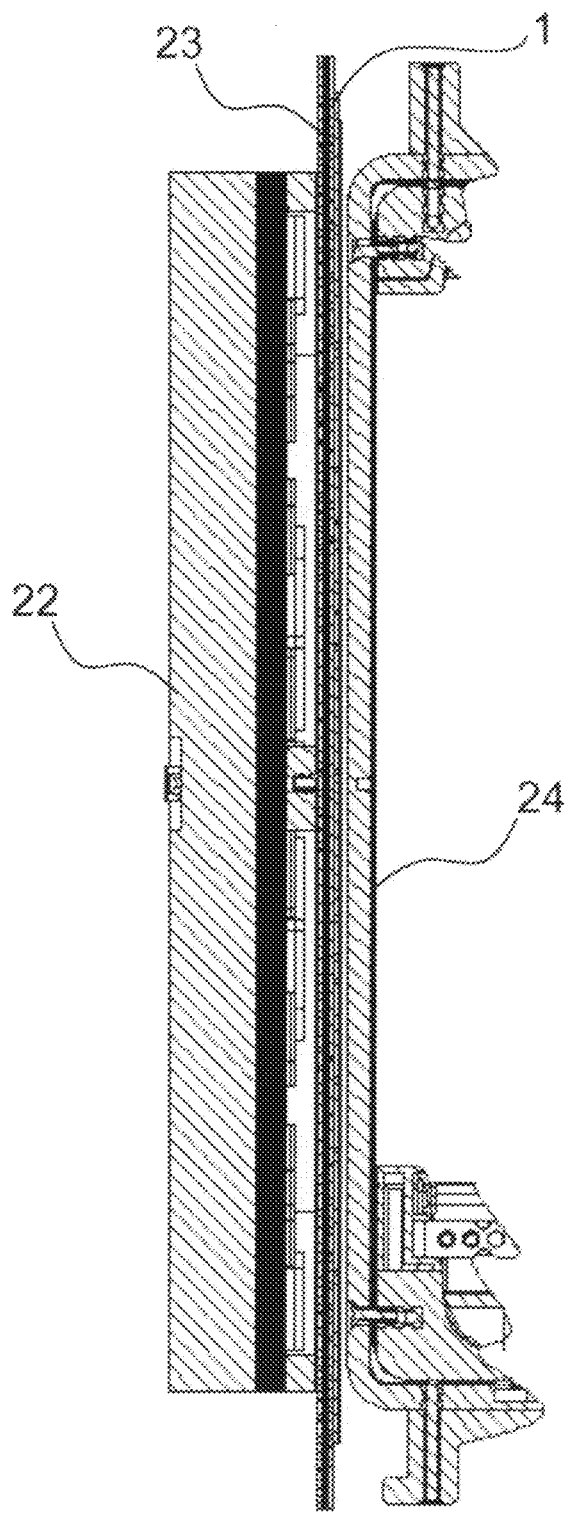
FIG. 19 is a side view of the functional parts lying on the permanent magnet, in assembled relation according to such additional embodiment.

FIG. 14 shows the magnetic correction dipoles and a housing frame for the magnetic correction dipole of smaller size.

Multiple types of correction dipoles may be provided, each having a plan shape and/or a plan size different from those of the other types.

Particularly, two magnetic dipoles 4' and 4" are shown, and the magnetic dipole 4" has a smaller plan size than the magnetic dipole 4', which is of the type of correction dipoles with the maximum plan size.

The recesses 14 in the magnetic correction dipole locating and fixing plate 1 have a plan shape and a plan size equal to or slightly larger than those of the type of magnetic correction dipoles with the maximum size.

Each of the types of magnetic correction dipoles having smaller sizes than those of the magnetic correction dipoles with the maximum plan size and/or shapes different therefrom is associated with a housing frame 5 whose plan shape and whose outer size match those of the type of magnetic correction dipoles with the maximum plan size, and which have a housing recess 50 therein having a plan shape that matches that of the corresponding additional type of the correction dipoles, and a size equal to or slightly larger than it.

Particularly, the figure shows a housing frame 5 whose outer size is substantially equal to that of the correction dipole 4' and which has the housing recess 50 therein.

This housing recess 50 has substantially the same size as the correction dipole 4", to accommodate the latter therein.

Thus, since the recesses 14 of the magnetic correction dipole locating and fixing plate 1 have plan shapes and sizes substantially equal to the type of magnetic correction dipoles with the maximum plan size, then the dipoles of smaller sizes can also be held in the recesses 14 and assume a fixed position due to said housing frames 5.

FIGS. 15 to 20 show a variant embodiment, differing from the one of FIGS. 6 to 13 of the Magnetic Resonance Imaging apparatus of the present invention, in which the structure has an annular shape.

In this variant embodiment, the yoke 20 has an annular shape, with two horizontal elements connected at their ends on each side by vertical wall elements along which the permanent magnets 21 and the pole pieces 22 are provided.

This variant embodiment also has the general configuration as described above concerning the first embodiment, with slightly different structures, as shown in the figures.

Unlike the embodiment of FIGS. 6 to 13, the pole piece 22 does not have a recessed compartment 26 but the gradient field generating coils, the transmitting antenna 23, and the magnetic correction dipole locating and fixing plate 1 lie directly on the pole piece, and are all covered by the end plate 24.

Therefore, in this configuration, the magnetic correction dipole locating and fixing plate 1 may be slid out from the side, like in the embodiment of FIGS. 4 and 5.

Figure 20:
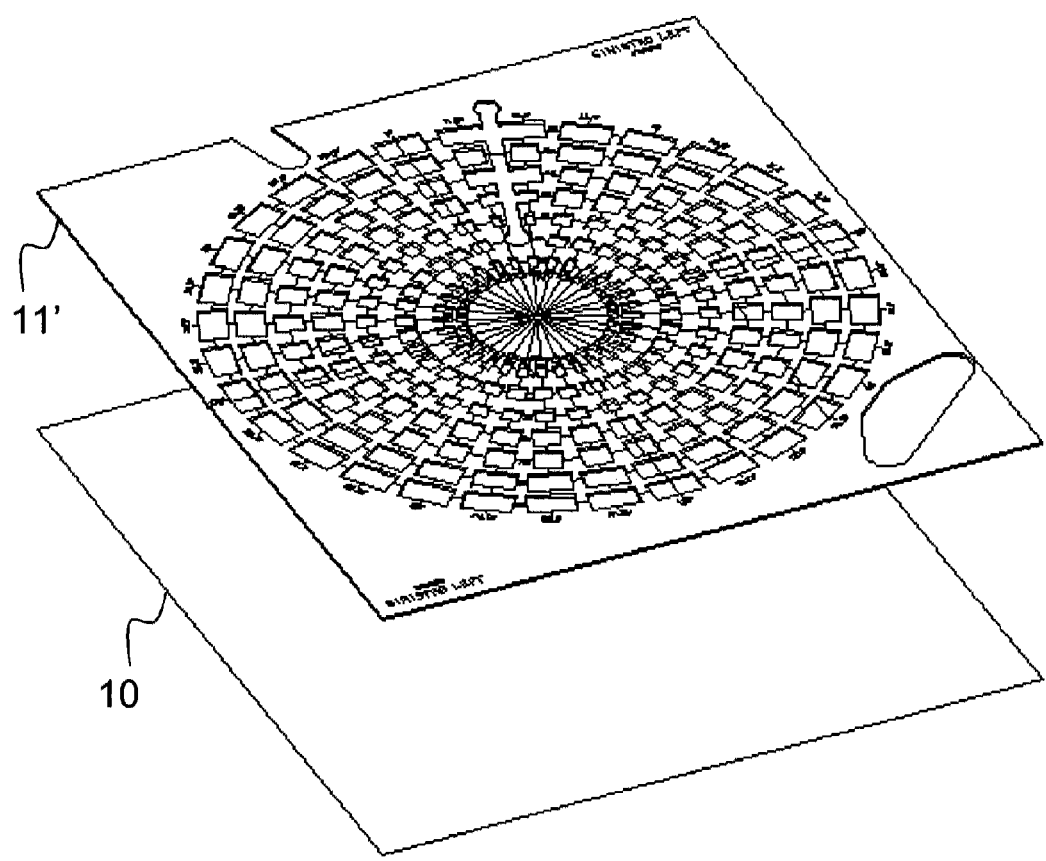
FIG. 20 is an exploded view of the components of the magnetic correction dipole locating and fixing plate according to such additional embodiment.

Likewise, FIG. 20 shows a square or rectangular magnetic correction dipole locating and fixing plate 1 suitable for the second variant embodiment, whose structure is similar in all respects to the circular plate of FIG. 12.

As mentioned above in the general introduction, other types of magnets may be also provided for generating the static field that is designed to permeate the patient receiving cavity, that may be of any type, regardless of the type of construction of the compartment for the shimming means, or of the means themselves.

Figure 21:
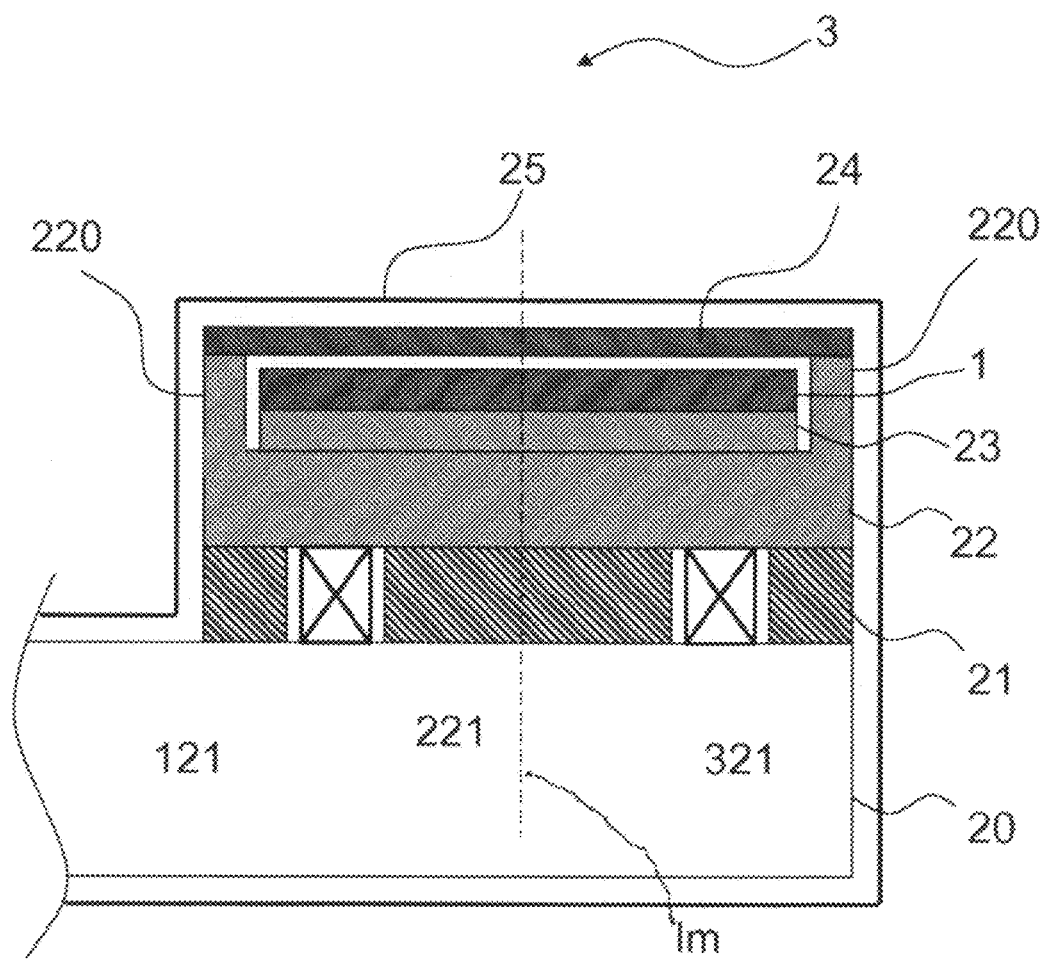
FIGS. 21 and 22 show, like FIGS. 3 and 4, an embodiment of a possible variant embodiment in which the magnet is of the resistive or superconducting type and particularly in which such magnet is formed as disclosed in EP 0 875 768 by the owner hereof.
Figure 22:
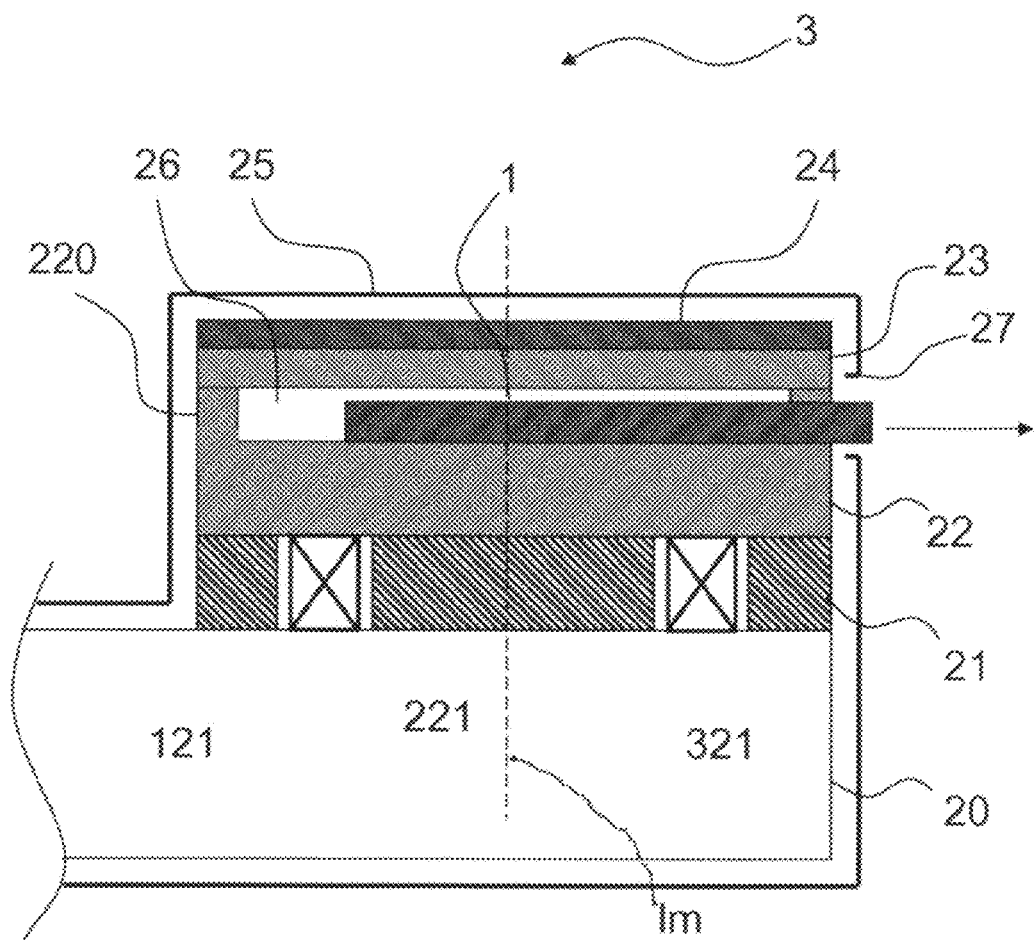

FIGS. 21 and 22 show, like FIGS. 3 and 4, an embodiment of a possible variant embodiment in which the magnet is of the resistive or superconducting type and particularly in which such magnet is formed as disclosed in EP 0 875 768 by the owner hereof.

In this case, instead of a permanently magnetized material in the form of one or more layers, the magnets 21 consist of at least one central core element 221 having a certain permeability and particularly made of a ferromagnetic material, which core element 221 is surrounded by resistive or superconducting magnetic field generating means 321, such as a conducting or superconducting coil, which is powered in a known manner for generating the magnetic field.

An additional element of predetermined permeability 121 may externally cover the coil 321 or the magnetic field generating means.

This construction may be extended to a series of concentric annular elements with magnetic field generating means, such as annular coils interposed therebetween.

The invention claimed is:

1. A Magnetic Resonance Imaging apparatus, comprising:
   a 3D structure having a patient receiving cavity for receiving a body under examination;
   means for generating a static magnetic field in said patient receiving cavity, said means for generating the static magnetic field comprising at least a pair of permanent magnets spaced from each other so that the patient receiving cavity is interposed between said permanent magnets;
   means for generating variable magnetic fields in said patient receiving cavity;
   an antenna for transmitting electromagnetic nuclear spin excitation pulses;
   an antenna for receiving the electromagnetic signals generated by nuclear spin relaxation;
   at least one pole piece being mounted to the side of each permanent magnet facing towards the patient receiving cavity;
   and an end plate provided on the side of said pole piece facing towards the patient receiving cavity;
   a plate provided for at least one of said pole pieces, in superimposed relation thereto, for locating and fixing magnetic dipoles for fine correction of magnetic field homogeneity, for the purposes of shimming;
   a compartment formed between the end plate and said pole piece for receiving the magnetic correction dipole locating and fixing plate, with one or more of said magnetic correction dipoles mounted thereto;
   said compartment being openable at the raised peripheral edge of the pole piece by the provision of an opening of such a width and height as to form a slot for insertion and removal of said magnetic correction dipole locating and fixing plate with one or more magnetic correction dipoles mounted thereto,
   said slot being provided underneath said antenna and said end plate, which remain in place during insertion and removal of the magnetic correction dipole and fixing plate.

2. A magnetic Resonance Imaging apparatus as claimed in claim 1, wherein said compartment is formed by a box like element being superimposed to the side of the pole facing the patient receiving cavity and placed between a corresponding pole piece and the end plate, said box like element having two parallel sides which are parallel to the side of the pole facing the patient receiving cavity and lateral peripheral walls oriented perpendicular to the two parallel walls, the distance of the two parallel walls being bigger than the maximum thickness of the plate for locating and fixing magnetic dipoles and the lateral peripheral walls being provided with an opening the thickness and the length of which allows the insertion inside the box like element and the extraction from the box like element of the said plate for locating and fixing magnetic dipoles, the opening being provided at the raised peripheral edge of the pole piece.

3. A Magnetic Resonance Imaging apparatus as claimed in claim 2, wherein the two parallel walls of the box like element which are parallel to the side of the pole facing the patient receiving cavity and/or the end plate are formed on one side by the side of said pole and on the other side by the end plate, a spacer rim or frame being provided between said end plate and said pole, the rim or frame being opened at one side forming an opening the thickness and the length of which allows the insertion inside the box like element and the extraction from the box like element of said plate for locating and fixing magnetic dipoles, the opening being provided at the raised peripheral edge of the pole piece.

4. A Magnetic Resonance Imaging apparatus as claimed in claim 1, wherein said compartment is formed by a recess in the side of the pole facing the patient receiving cavity, said pole being provided on the side facing the patient receiving cavity with a peripheral rim forming the lateral peripheral walls of the compartment while said end plate is supported by the peripheral rim, closing the compartment on the side facing the patient receiving cavity and at least one part of the rim is removably secured to the pole forming the closing member of an opening for inserting and extracting the plate for locating and fixing the magnetic correction dipoles.

5. A Magnetic Resonance Imaging apparatus as claimed in claim 1, wherein said pair of permanent magnets and are each formed of at least one layer of magnetized material, with the side facing towards the patient receiving cavity having at least one layer of ferromagnetic material, that forms said pole piece, lying thereon.

6. A Magnetic Resonance Imaging apparatus as claimed in claim 1, wherein said magnets are of resistive or superconducting type and have a side facing towards the patient receiving cavity with at least one layer of ferromagnetic material, that forms said pole piece, lying thereon.

7. A Magnetic Resonance Imaging apparatus as claimed in claim 1, wherein the direction of insertion and removal of said magnetic correction dipole locating and fixing plate is parallel to the surface of said magnetic correction dipole locating and fixing plate and/or pole piece and/or end plate.

8. A Magnetic Resonance Imaging apparatus as claimed in claim 1, wherein the compartment has slide guides for removal and insertion of the magnetic correction dipole locating and fixing plate, which cooperate with corresponding slide elements of the magnetic correction dipole locating and fixing plate, which guides are oriented parallel to each other and parallel to the surface of said magnetic correction dipole locating and fixing plate and/or the pole piece and/or the end plate.

9. A Magnetic Resonance Imaging apparatus as claimed in claim 1, wherein limit stops are provided for limiting the motion of removal of the magnetic correction dipole locating and fixing plate from said compartment through said insertion and removal slot.

10. A Magnetic Resonance Imaging apparatus as claimed in claim 1, wherein said means for generating variable magnetic fields include gradient field generating coils, and said gradient field generating coils and the transmitting antenna are directly mounted to the pole piece, the compartment for the magnetic correction dipole locating and fixing plate being situated between said gradient field generating coils and said transmitting antenna on the one hand and the end plate on the other.

11. A Magnetic Resonance Imaging apparatus as claimed in claim 1, wherein the magnetic correction dipole locating and fixing plate has a plurality of recesses for holding magnetic correction dipoles.

12. A Magnetic Resonance Imaging apparatus as claimed in claim 11, wherein the recesses have a plan shape and a depth that match those of one or more correction dipoles, so that the latter may be held in concealed relation in said recesses.

13. A Magnetic Resonance Imaging apparatus as claimed in claim 11, wherein one or more types of correction dipoles may be provided, each of said types having a plan shape and/or a plan size differing from those of the other types, the recesses in the magnetic correction dipole locating and fixing plate having a plan shape and a plan size equal to or slightly larger than those of the type of magnetic correction dipoles with the maximum plan size.

14. A Magnetic Resonance Imaging apparatus as claimed in claim 13, wherein each of the additional types of magnetic correction dipoles having smaller sizes than those of the magnetic correction dipoles with the maximum plan size and/or shapes different therefrom is associated with a housing frame whose plan shape and whose outer size match those of the type of magnetic correction dipoles with the maximum plan size, and which have a housing recess therein having a plan shape that matches that of the corresponding additional type of the correction dipoles, and a size equal to or slightly larger than it.

15. A Magnetic Resonance Imaging apparatus as claimed in claim 11, wherein the recesses have different depths in different areas of the magnetic correction dipole locating and fixing plate.

16. A Magnetic Resonance Imaging apparatus as claimed in claim 11, wherein the magnetic correction dipole locating and fixing plate is composed of a base plate with one or more apertured plates lying thereon, the latter having one or more through apertures whose shape and size match those of the recesses for the magnetic correction dipoles, at least some of said apertures in one of said apertured plates being coincident with the apertures of at least one further apertured plate, the apertures of the apertured plates forming the peripheral walls of said recesses.

17. A Magnetic Resonance Imaging apparatus as claimed in claim 11, wherein the magnetic correction dipole locating and fixing plate is composed of a base plate and a plurality of apertured plates, some of which extend over part of the overall surface area of the base plate or an underlying apertured plate.

18. A Magnetic Resonance Imaging apparatus as claimed in claim 16, wherein at least some of the apertured plates are thicker than other apertured plates.

19. A Magnetic Resonance Imaging apparatus as claimed in claim 1, wherein said means for generating variable magnetic fields includes gradient coils.

20. A Magnetic Resonance Imaging apparatus as claimed in claim 1, wherein said end plate comprises a gantry.

* * * * *